US007879411B2

(12) United States Patent
Hass et al.

(10) Patent No.: US 7,879,411 B2
(45) Date of Patent: Feb. 1, 2011

(54) METHOD AND APPARATUS FOR EFFICIENT APPLICATION OF SUBSTRATE COATING

(75) Inventors: Derek D Hass, Charlottesville, VA (US); James F. Groves, Charlottesville, VA (US); Haydn N. G. Wadley, Keswick, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 2221 days.

(21) Appl. No.: 10/476,309

(22) PCT Filed: Apr. 30, 2002

(86) PCT No.: PCT/US02/13639

§ 371 (c)(1), (2), (4) Date: Oct. 29, 2003

(87) PCT Pub. No.: WO02/087787

PCT Pub. Date: Nov. 7, 2002

(65) Prior Publication Data

US 2004/0134430 A1 Jul. 15, 2004

Related U.S. Application Data

(60) Provisional application No. 60/287,605, filed on Apr. 30, 2001.

(51) Int. Cl.
*B05D 3/06* (2006.01)

(52) U.S. Cl. ....................................... 427/566; 118/726

(58) Field of Classification Search .............. 427/248.1, 427/255.23, 566; 118/726
See application file for complete search history.

(56) References Cited

U.S. PATENT DOCUMENTS 4,687,939 A * 8/1987 Miyauchi et al. ......... 250/492.2

(Continued)

FOREIGN PATENT DOCUMENTS

DE 19841012 * 1/2000

OTHER PUBLICATIONS

Hass et al, Electron beam directed vapor deposition of thermal barrier coatings, J. Vac. Sci. Technol. A (!6)6, Nov./Dec. 1998, pp. 3396-3401.*

*Primary Examiner*—Timothy H Meeks
*Assistant Examiner*—Elizabeth Burkhart
(74) *Attorney, Agent, or Firm*—Novak Druce DeLuca + Quigg LLP; Robert J. Decker

(57) ABSTRACT

A direct vapor deposition (DVD) method and apparatus for applying coating(s) on substrate(s), including: presenting at least one of the substrates to a chamber, presenting at least one evaporant source (125) in crucible (110) to the chamber; presenting at least one carrier gas stream (105) to the chamber using a ring-shaped (133) converging/diverging nozzle (130); impinging at least one evaporant source with at least one electron beam in the chamber to generate an evaporated vapor flux in a main direction respective for any of the evaporant sources impinged by the electron beam; and guiding at least one of the generated evaporated vapor flux by at least one carrier gas stream from the ring shaped gap (132), which is essentially parallel to the main direction and substantially surrounds the evaporated flux. The evaporated vapor flux at least partially coats at least one of the substrates.

18 Claims, 18 Drawing Sheets

U.S. PATENT DOCUMENTS 4,812,326 A * 3/1989 Tsukazaki et al. ........... 427/562
4,989,541 A * 2/1991 Mikoshiba et al. .... 118/723 ME
5,736,073 A * 4/1998 Wadley et al. ................ 264/10

* cited by examiner

METHOD AND APPARATUS FOR EFFICIENT APPLICATION OF SUBSTRATE COATING

RELATED APPLICATIONS

This application is a national stage filing of International Application No. PCT/US02/13639, filed 30 Apr. 2002, which claims benefit under 35 U.S.C. Section 119(e) from U.S. Provisional Application Ser. No. 60/287,605 filed Apr. 30, 2001, entitled "Method for Efficient Application of a Coating to a Substrate," the entire disclosures of which are hereby incorporated by reference herein in their entirety.

GOVERNMENT SUPPORT

This invention was made with government support under the Office of Naval Research—DURIP Grant Nos. N00014-98-1-0355 and N00014-00-1-0147. The government has certain rights in the invention.

FIELD OF THE INVENTION

The present invention provides a method and an apparatus for efficiently applying a coating to a surface using a directed vapor deposition (DVD) approach, and more particularly the use of improved nozzle devices and related methods.

BACKGROUND OF TIE INVENTION

The application of a coating to a substrate of a prescribed geometry is required in a variety of engineering applications, including thermal or environmental protection of the substrate, improved wear resistance, altered optical properties or creation of devices on the substrate such as thin film batteries. In all such cases, the ability to deposit compositionally controlled coatings efficiently, uniformly, at a high rate, with high part throughput, and in a cost-effective manner is desired. Some illustrative examples of deposition systems are provided in the following applications and patents and are co-assigned to the present assignee 1) U.S. Pat. No. 5,534,314, filed Aug. 31, 1994, entitled "Directed Vapor Deposition of Electron Beam Evaporant", 2) U.S. application Ser. No. 09/634,457, filed Aug. 7, 2000, entitled "Apparatus and Method for Intra-layer Modulation of the Material Deposition and Assist Beam and the Multilayer Structure Produced Therefrom", and 3) PCT International Application No. PCT/US01/16693, filed May 23, 2001, entitled "Process and Apparatus for the Plasma Activated Deposition in a Vacuum". These applications are hereby incorporated by reference herein in their entirety. The present invention discloses, among other things an apparatus and a method for applying a coating(s) on a substrate(s) in an improved and more efficient manner. The present invention method can be applied to coatings of any type onto any substrate geometry. In this document, the application of a thermal barrier coating to a turbine blade is used as a non-limiting example.

Vapor phase processes are widely used for applying thermal and environmental protection coating systems to components. They are widely used to protect the hot structural components of many gas turbine engines that must operate at temperatures approaching their melting point [1]. As gas inlet temperatures continue to rise, failure by thermally-induced mechanisms has been avoided by making airfoil components with internal cooling conduits, and injecting compressor discharge air to decrease the component temperature [2]. To maximize engine efficiency, however, it is desirable to minimize the use of this air for cooling purposes. Traditionally, this has been accomplished by designing more efficient cooling geometries within the component and by film cooling of the component surface using drilled holes. These approaches have now matured and alternate strategies that exploit the insulating abilities of thermal barrier coatings (TBC's) are being investigated for the thermal protection of engine components.

The TBC systems currently in use are multilayer systems consisting of an yttria partially-stabilized zirconia (YSZ) top layer that thermally protects the superalloy component, and an underlying MCrAlY (M=Ni, Co) or nickel aluminide bond coat which improves the YSZ adhesion. The YSZ layer has a relatively high thermal expansion coefficient to limit thermally induced strains and a low thermal conductivity resulting in surface temperature reductions of up to 170° C. [3]. This layer is well bonded to a thin (approximately 1 μm) thermally grown (aluminum) oxide (TGO) layer which impedes oxidation and hot corrosion of the underlying component [4]. This TGO layer is formed on the surface of the aluminum-rich alloy layer (bond coat). Either a low pressure plasma spray [5] (LPPS) or pack cementation [6] approach is used to apply the bond coat layer. The high temperature oxidization environment present prior to and during deposition leads to growth of a thin TGO layer at the interface between the TBC and the bond coat layer [7]. The generated YSZ layer consists of a "nontransformable" tetragonal (t') phase having a complex microstructure consisting of twins and anti-phase boundaries. This microstructure yields a thermomechanically tough coating which has been shown to improve TBC performance by limiting crack propagation in the YSZ layer [8].

To date, the lowest cost TBC's have been applied using the plasma spray (PS) process, such as an air plasma spray (APS) process. The approach employs a plasma or combustion torch to melt and spray deposit YSZ droplets onto airfoil substrates. These deposits contain disc-like pores in the plane of the coating resulting in a YSZ top layer that has an extremely low thermal conductivity. This is due to the high thermal resistance of the pores oriented normal to the heat flow direction. Unfortunately, these layers also have poor spallation resistance, resulting from a combination of the disc-like coating defects and the large thermal expansion mismatch between the YSZ layer and the bond coat [9]. This lack of reliability limits these coatings to component life extension at current operating temperatures (i.e., they cannot be used to increase engine temperature).

More recently, TBC's have been produced by electron beam-physical vapor deposition (EB-PVD). Using this technique the YSZ layer has a columnar microstructure with elongated inter-columnar voids aligned perpendicular to the substrate surface. This structure results in a low in-plane stiffness that limits thermomechanical stresses on heating/cooling and improved spallation resistance compared to the LPPS layers [10]. The columns exhibit a tapered shape, growing wider with increased thickness, a faceted surface and a strong {200} crystallographic texture [11]. Failure in these coatings no longer occurs within the YSZ layer but at the TGO/bond coat interface. This failure path appears to result from large stresses within the TGO layer, which increase with oxidation induced layer growth in service [12, 13]. For turbine blade applications, EB-PVD TBC's have the further advantages of limiting the undesirable blocking of air cooling holes during deposition and generating a smoother, more aerodynamic surface [14]. However, EB-PVD coatings have a higher thermal conductivity than their LPPS counterparts [15] and are more costly to apply (due to high equipment costs, deposition efficiencies of about 2-5 percent of the evaporated flux, and relatively slow (approximately 5 micrometers (μm) $min^{-1}$) deposition rates) [16]. To make vapor phase deposited TBC's a viable means for increasing engine performance, improved deposition techniques/strategies are needed.

The cost of the EB-PVD coatings can be as much as ten times that of PS coatings. The higher equipment costs of EB-PVD are a result of the high vacuum environment that is necessary during deposition (e.g., typically below $10^{-6}$ Torr), high cost of high power electron beam guns, and sophisticated component manipulation needed to achieve acceptable coatings. The operating pressure defines the vacuum pump requirements with lower pressures generally needing more expensive pumps. The low deposition rate and low materials utilization efficiency (MUE) of EB-PVD is related to the distribution of the vapor flux as it leaves the evaporated source. Generally, the vapor flux spreads out from the source with a distribution described by a $\cos^n\theta$ function (where n=2,3,4 or more, and θ is the angle to the normal axis). The general alignment of the normal axis is referred to herein as the main direction. When relatively long source-to-substrate distances are required (e.g., as in YSZ deposition using EB-PVD where this distance often approaches 50 cm to avoid substrate overheating) deposition efficiency is dramatically decreased to 1-5 percent of the evaporated flux and the deposition rate is proportionally reduced. To overcome the low deposition rate, the evaporation rate from the source materials is raised by increasing the electron beam power. However, this is costly and during YSZ evaporation, increased beam power leads to the production of molten droplets of material rather than atomistic vapor. This produces coating defects, and as a result, other approaches must be used to increase deposition rates. The high cost of deposition also impedes the use of physical vapor deposition methods for the deposition of bond coats.

The low deposition efficiency results from flux spreading beyond the periphery of the sample. One approach to reduce the spread of the flux exploits entrainment of the vapor in a controllable inert (e.g. helium or argon) carrier gas flow [17]. Such an approach is used in electron beam directed vapor deposition (EB-DVD). In this approach, the combination of a continuously operating 60 kV/10 kW axial e-beam gun (modified to function in a low vacuum environment) and an inert carrier gas jet is used. As shown in FIG. 1, in this system the vaporized material is entrained in the carrier gas jet 5 created using a converging/diverging nozzle 30 configuration and deposited onto the substrate or target 20 at high rate and with a high materials utilization efficiency [18]. Preliminary results have shown that YSZ layers having a columnar structure, a low thermal conductivity, the t' phase structure and a (200) texture can be produced using this technique [19]. Therefore the use of EB-DVD to produce low cost TBC's appears feasible. However, current versions of the EB-DVD process make inefficient use of the gas jet, which is a significant contribution to the process cost. They are also limited in their ability to spatially manipulate the flux.

There exists a need in the art for a cost-effective method to apply coatings to surfaces. The present invention addresses this need and provides, among other things, how to further manipulate the spatial distribution of the atomic flux and more efficiently utilize the carrier gas.

SUMMARY OF THE INVENTION

The present invention provides a method and an apparatus for efficiently applying a coating to a surface using a directed vapor deposition (DVD) approach. While this document may primarily describe the present invention method of applying a thermal barrier coating onto a turbine blade, the present invention method and apparatus has equal or greater utility for the deposition of metal, ceramic, semiconductor or dielectric coatings in a variety of applications including but not limited to fuel cells, thin film batteries, medical product coatings, and energy transmission systems.

In a first embodiment, the present invention provides a method for applying at least one coating on at least one substrate. The method includes: presenting at least one of the substrates to a chamber, wherein the chamber has an operating pressure ranging from about 0.1 to about 32,350 Pa; presenting at least one evaporant source to the chamber; presenting at least one carrier gas stream to the chamber; impinging at least one the evaporant source with at least one electron beam in the chamber to generate an evaporated vapor flux in a main direction respective for any of the evaporant sources impinged by the electron beam; and deflecting at least one of the generated evaporated vapor flux by at least one of the carrier gas streams. The carrier gas stream is essentially parallel to the main direction and substantially surrounds the evaporated flux, and the evaporated vapor flux at least partially coats at least one of the substrate.

In a second embodiment, the present invention provides an apparatus for applying at least one coating on at least one substrate. The apparatus includes a chamber, wherein the chamber has an operating pressure ranging from about 0.1 to about 32,350 Pa, wherein at least one of the substrates is presented in the chamber. The apparatus further comprises: at least one evaporant source disposed in the chamber; at least one carrier gas stream provided in the chamber; and at least one electron beam. The electron beam impinges at least one the evaporant source with at least electron beam in the chamber to generate an evaporated vapor flux in a main direction respective for any of the evaporant sources impinged by the electron beam; and deflects at least one of the generated evaporated vapor flux by at least one of the carrier gas stream, wherein the carrier gas stream is essentially parallel to the main direction and substantially surrounds the evaporated flux. The evaporated vapor flux at least partially coats at least one substrate.

While DVD and its associated converging/diverging nozzle system is generally known by those skilled in the art, the improvements provided by the present invention are attributed to, inter alia, the introduction of a ring nozzle into the DVD technology. Various configurations of the new ring nozzle technology are described herein and shown to convey the advantages that follow. The advantages of the present invention include, but are not limited to: improved use of expensive gases, increased deposition efficiency, improved uniformity in the coating, a means for coating of multiple components with non-planar geometry such as turbine blades/vanes, a means for efficiently heating the parts during coating, and a means for controlling the composition of the coating. These improvements will allow for high rate deposition of multiple components per run leading to a high component throughput while still using a low cost deposition process and producing coatings with the desired properties.

Moreover, computer modeling reveals that the present invention is novel and has not been taught or suggested in the conventional art. Further yet, the modeling reveals novel, useful, and non-obvious interaction of the ring nozzle gas flow with vapor leaving a crucible source. The result is a dramatically improved method for the efficient application of a coating to a surface.

DESCRIPTION OF THE FIGURES

The foregoing and other objects, features, and advantages of the present invention, as well as the invention itself, will be more fully understood from the following description of preferred embodiments, when read together with the accompanying drawings, in which.

DESCRIPTION OF THE PREFERRED EMBODIMENTS

Deposition Efficiency

Figure 1:
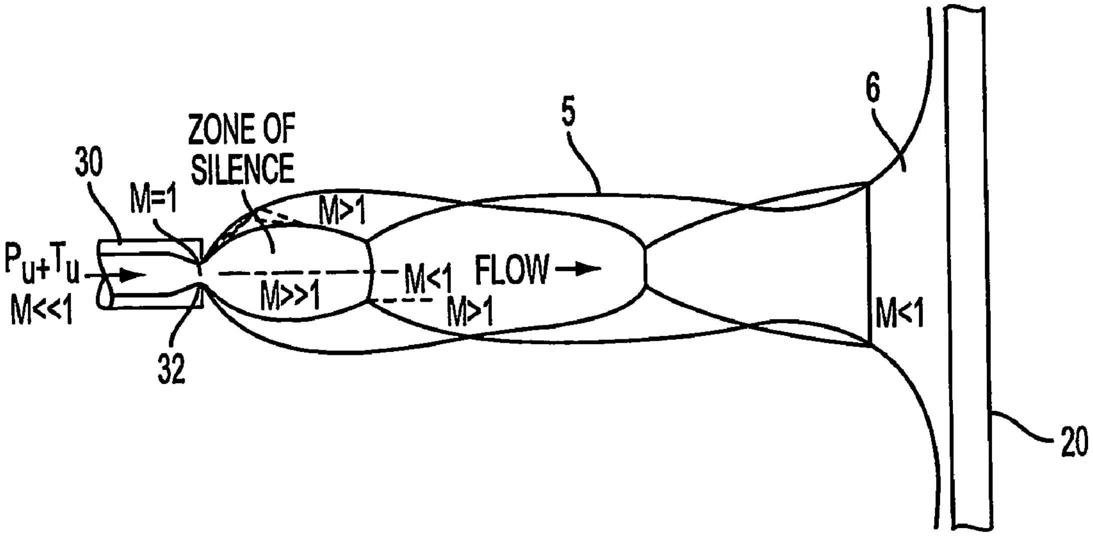
FIG. 1 is an elevational schematic illustration of a converging/diverging nozzle used to create a supersonic carrier gas jet in a EB-DVD deposition approach.
Figure 2:
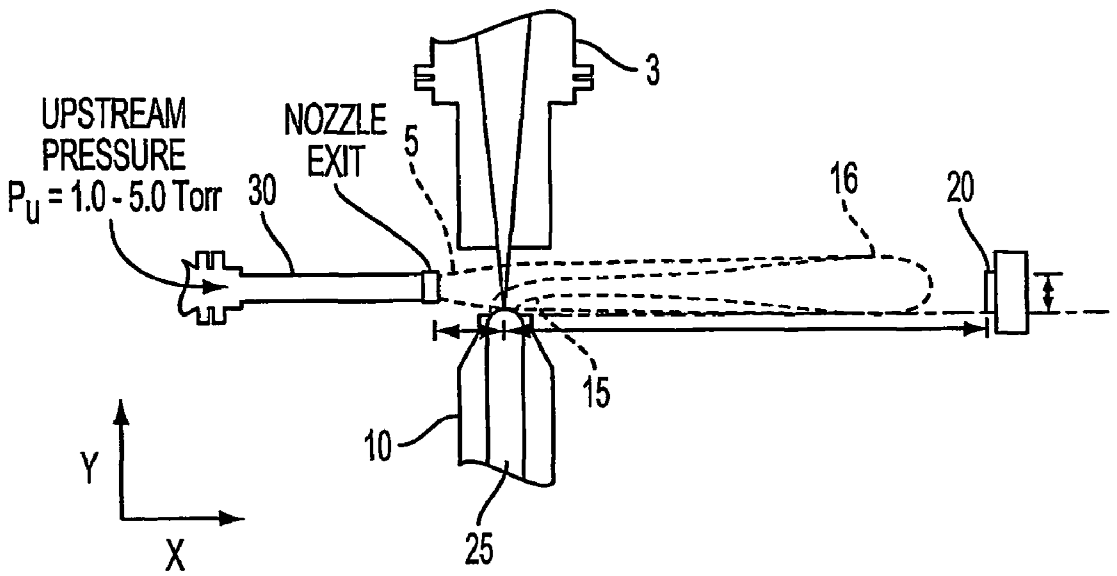
FIG. 2 is a schematic illustration of the DVD coating process using a 90 degree configuration (referred to as DVD I herein this document).

Schematically shown in FIG. 2, as well as described by Hass [20], there is provided a DVD apparatus to deposit the YSZ top layer of a TBC in which a carrier gas jet 5 was aligned at a 90 degree angle to the direction of the evaporated vapor flux 15 Also shown is the crucible 10, nozzle 30, electron beam system 3 and YSZ source 25. This arrangement required a relatively high chamber pressure (greater than 26 Pa)/high carrier gas flow rate (greater than 8.0 (measured in standard liters per minute (slm)) combination to redirect the vapor 16 towards the substrate 20. However, the high pressure/gas flow rate resulted in the formation of a wall jet at the substrate. When strong enough, this wall jet could affect the vapor atom angle of incidence and in some cases turn the vapor away from the substrate. This results in limited deposition efficiency of the process (about 5 to 10 percent for a 2.54 cm diameter substrate located 10 cm from the source). Lower gas flow rates/chamber pressures may not be used in this configuration as this decreases the vapor phase collisions, which occur during vapor transport, and results in the vapor no longer being completely redirected 90 degrees towards the substrate (while below a critical chamber pressure and gas flow rate). This limits the deposition rate of the process.

Figure 3:
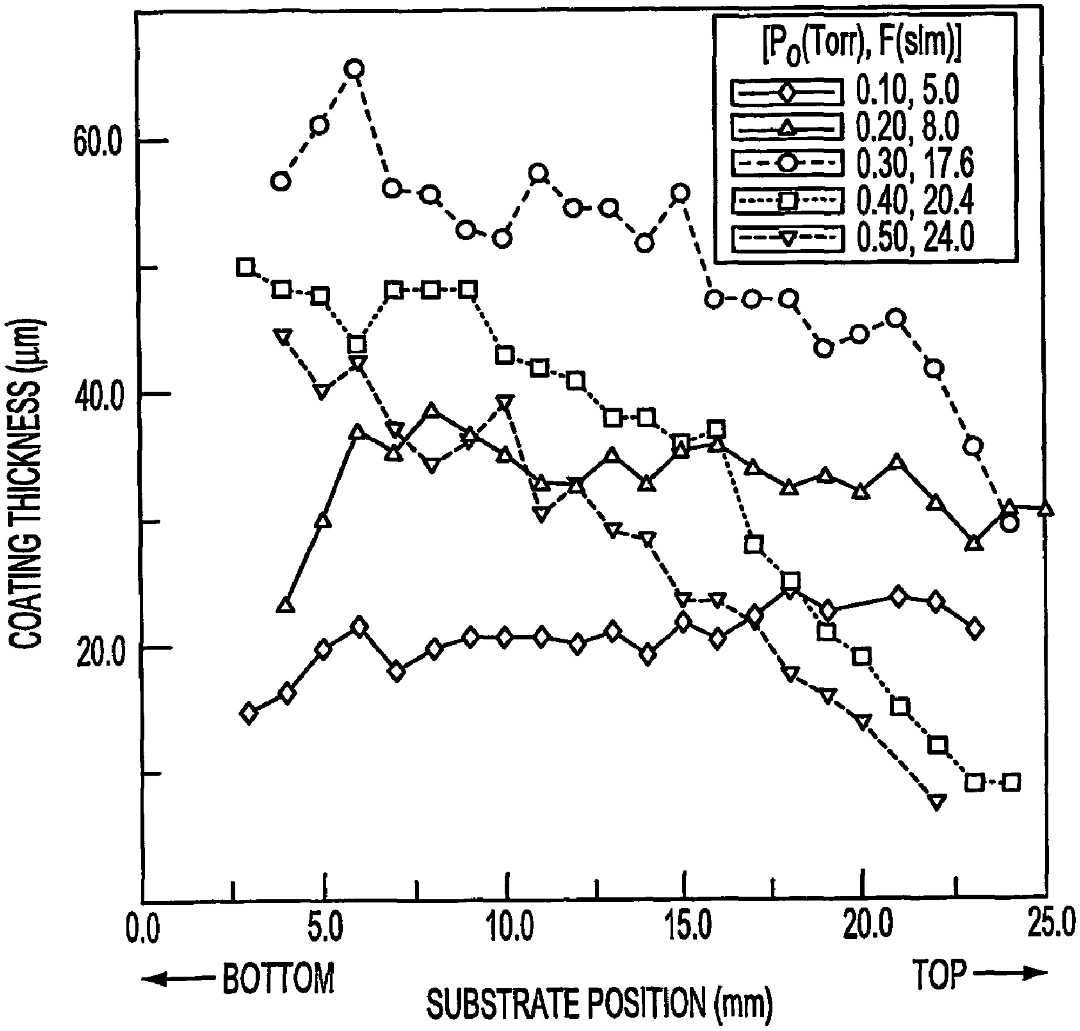
FIG. 3 is a graphical representation showing the coating uniformity of a thermal barrier coating applied to a 1.0 inch diameter substrate as a function of chamber pressure.

Increasing the evaporation rate is not useful in this configuration since a higher evaporation rate requires a higher gas flow rate/chamber pressure to redirect it towards the substrate and therefore the deposition efficiency of the process is decreased as the evaporation rate is increased and little or no increase in the deposition rate is observed. The use of high chamber pressures/gas flow rates has also been found to result in cluster formation in the vapor phase. This leads to very porous (50 percent) coatings, which may be expected to have poor erosion resistance. As shown in FIG. 3, provided is a graphical representation comparing the substrate position with the coating thickness as a function of chamber pressure and gas flow. This approach identifies the coating uniformity of a thermal barrier coating applied to a 1.0 inch diameter substrate as a function of chamber pressure. It should be noted that the higher chamber pressures, Po, lead to increasingly non-uniform thickness distributions. Accordingly, high gas flow rates/chamber pressures result in nonuniformity of the coating thickness. When significant nonuniformity exists, x-y substrate translation is required in order to achieve a uniform coating thickness.

Figure 4:
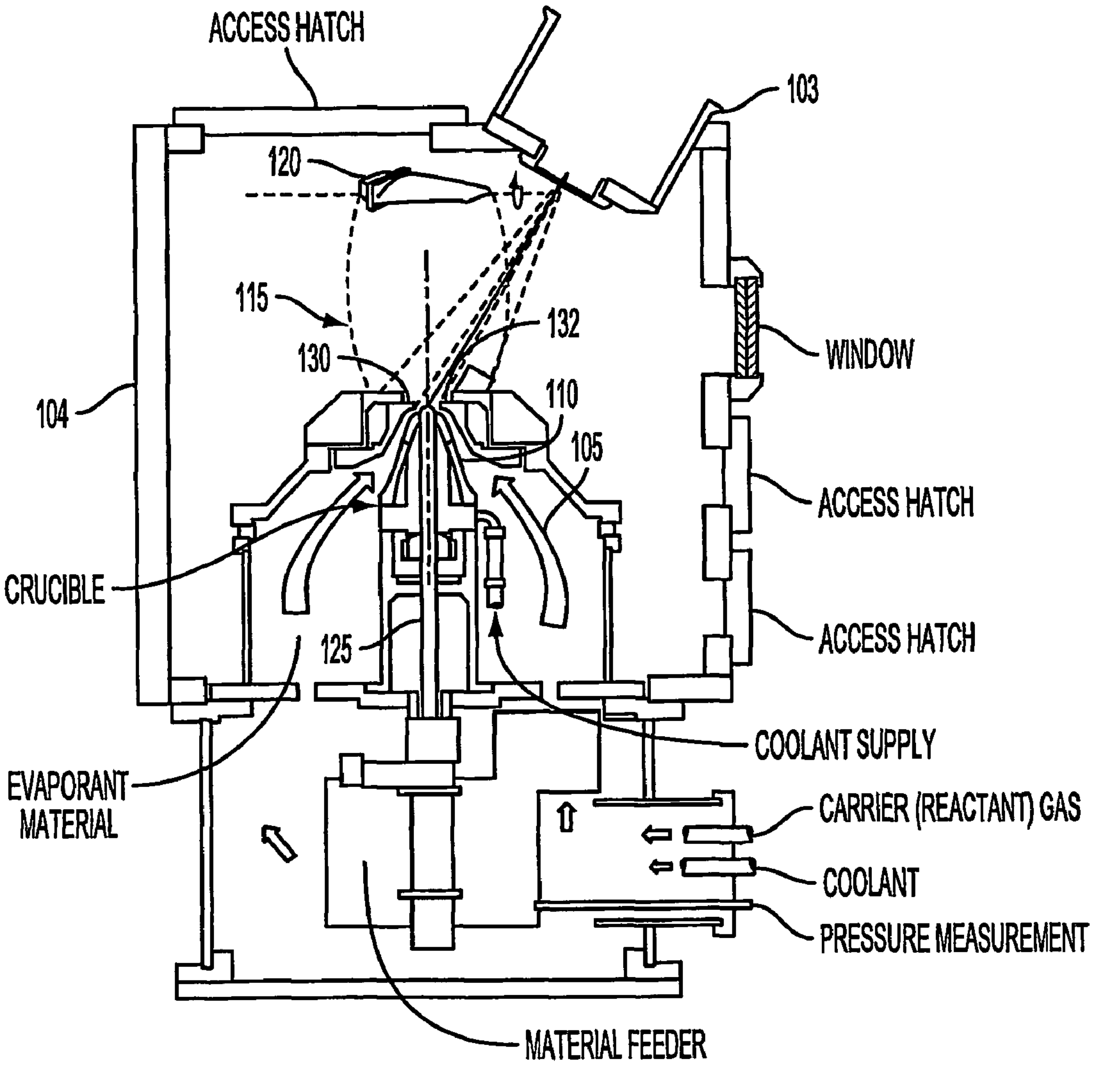
FIG. 4 schematically shows a preferred embodiment of a DVD system (referred to as DVD II).

Turning to FIG. 4, as a first aspect of the present invention, the aforementioned DVD process was reconfigured to the preferred embodiment as schematically shown in FIG. 4, to improve the deposition efficiency, increase the deposition rate and enhance the coating uniformity. In the preferred embodiment, the carrier gas 105 is realigned so that it is substantially in-line with the crucible 110. In this alignment, the carrier gas flow is placed completely or substantially around the crucible 110 so that the vapor flux 115 no longer has to be turned 90 degrees towards the substrate 120, but rather can be simply focused onto the substrate located directly above the evaporant source 125. The carrier gas 105 flows substantially parallel with the normal axis, identified as CL. Additionally, as will be discussed later herein, the nozzle 130 has a nozzle gap or opening 132, through which the carrier gas 105 flows, is designed such that a more optimal carrier gas speed distribution for focusing the vapor 115 is produced. Also shown is the electron beam gun 103 and vacuum chamber 104.

Carrier Gas Costs

The configuration of the preferred embodiment offers dramatically improved benefits to coating efficiency and cost compared to existing techniques. First, the cost of the DVD process depends in part on the cost of the carrier gas, which is used to focus the vapor. The method by Hass et al. uses a helium/oxygen carrier gas jet mixture. However, deposition efficiency studies have shown that vapor can be focused to the same amount using less gas when argon is used instead of helium as the carrier gas. Typically the carrier gas flow can be cut in half for argon. In addition, helium is 2.5 times more expensive than argon so that argon usage will further reduce the cost of operation for the technology.

Component Heating

In addition, TBC's are typically applied at a very high temperature (e.g., 1050° C.). This temperature is achieved by pre-heating the blade before it is entered into the chamber. The radiant heat from the large 2.0-inch diameter source rod is used to maintain the substrate temperature during deposition (blade heating). In the configuration of Hass et al., the substrate is placed along side the source so that little radiant heat is obtained In addition, convective cooling from the carrier gas jet further reduces the substrate temperature. Thus this approach is not conducive to substrate heating and requires more advanced and difficult methods.

However, by reconfiguring the system in the present invention, such that the blade is placed directly above the source and the carrier gas flow rate may be decreased, the amount for radiant heat from the source is greatly increased and thus blade heating using a standard pre-heating furnace may be realized.

Moreover, in the existing design of the conventional DVD system, both the vapor and carrier gas flow pass through supersonic shock waves as the gas and vapor move away from the gas flow nozzle. These shock waves affect the density and distribution of the vapor. When a coating surface is then placed such that it intersects the flow, the resulting atomic structure of growing film can be affected by the distance from the gas flow nozzle to the coating surface (relative to the shocks in the flow). In the present invention system, there will still be supersonic shock waves in the carrier gas flows emerging from the ring nozzle. However, since the vapor is no longer incorporated directly into that carrier gas flow, its distribution and density will be less affected by the shocks in the system. As a result, the present invention process will become less critically dependent upon the position of gas flow nozzle and coating surface. Thus, when the geometry of the part being coated dictates a smaller (or larger) source to substrate separation, the present invention system design will be able to more easily accommodate such parts while still producing the desired atomic structure.

Figure 5A:
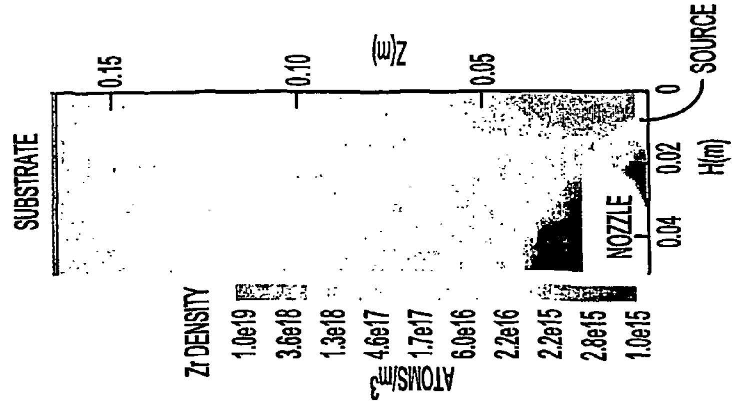
FIGS. 5(A)-5(D) show direct simulation Monte Carlo (DSMC) simulations, which demonstrate the change in the focus of vapor flux when the helium carrier gas flow rate was increased (FIGS. 5(A)-5(C)), and when an argon carrier gas was used (FIG. 5(D).
Figure 5B:
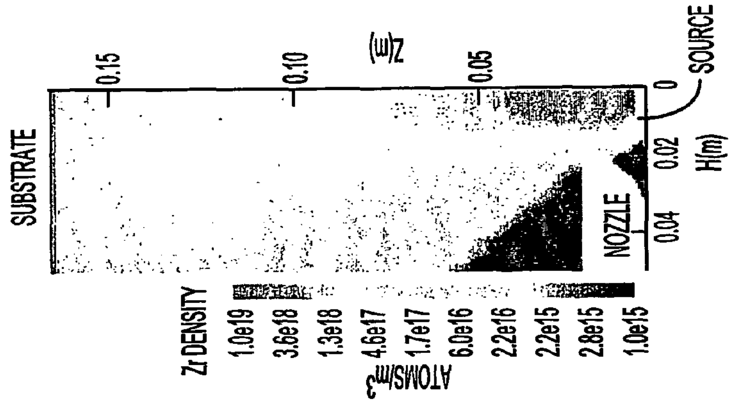
Figure 5C:
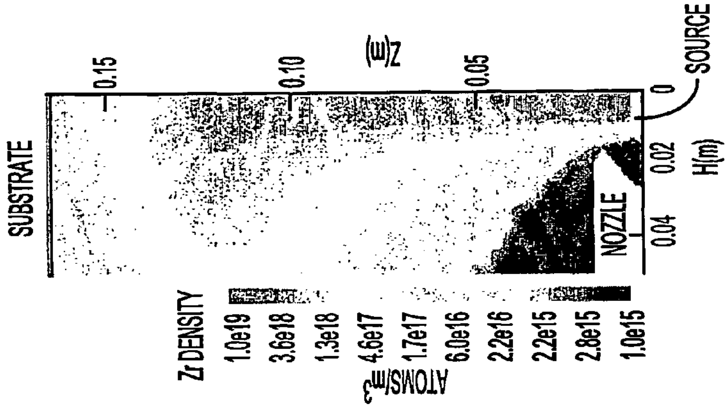
Figure 5D:
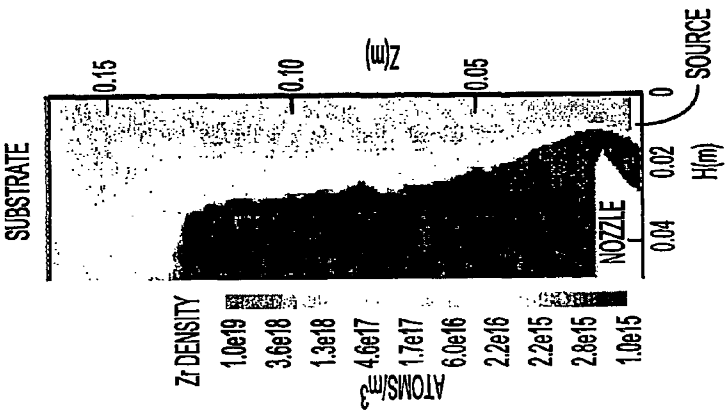

Experimental and simulation results, as discussed hereafter, indicate that the vapor flux can be focused using the present invention configuration to allow for deposition onto a limited area and to improve the process efficiency. The ability to focus the vapor cloud can be seen in FIG. 5. The direct simulation Monte Carlo (DSMC) simulations are shown for several helium and argon flow rates. The DSMC simulation, as captured in FIGS. 5A-5C, show the change in the focus of vapor flux when the helium carrier gas flow rate was increased. Where as shown in FIG. 5D an argon carrier gas was used. It can be observed that the use of an argon carrier gas resulted in the well focused vapor flux required for efficiently coating small components. Also, the focus of the vapor stream can be tailored to the size of the part or area on a part to be coated by altering the gas flow rate. The vapor stream can be altered in a variety of ways including altering the carrier gas flow rate, the ratio of the upstream to downstream pressures and the size of the nozzle opening. Focusing the vapor stream results in a higher deposition efficiency onto small parts than compared to the conventional design.

Figure 6:
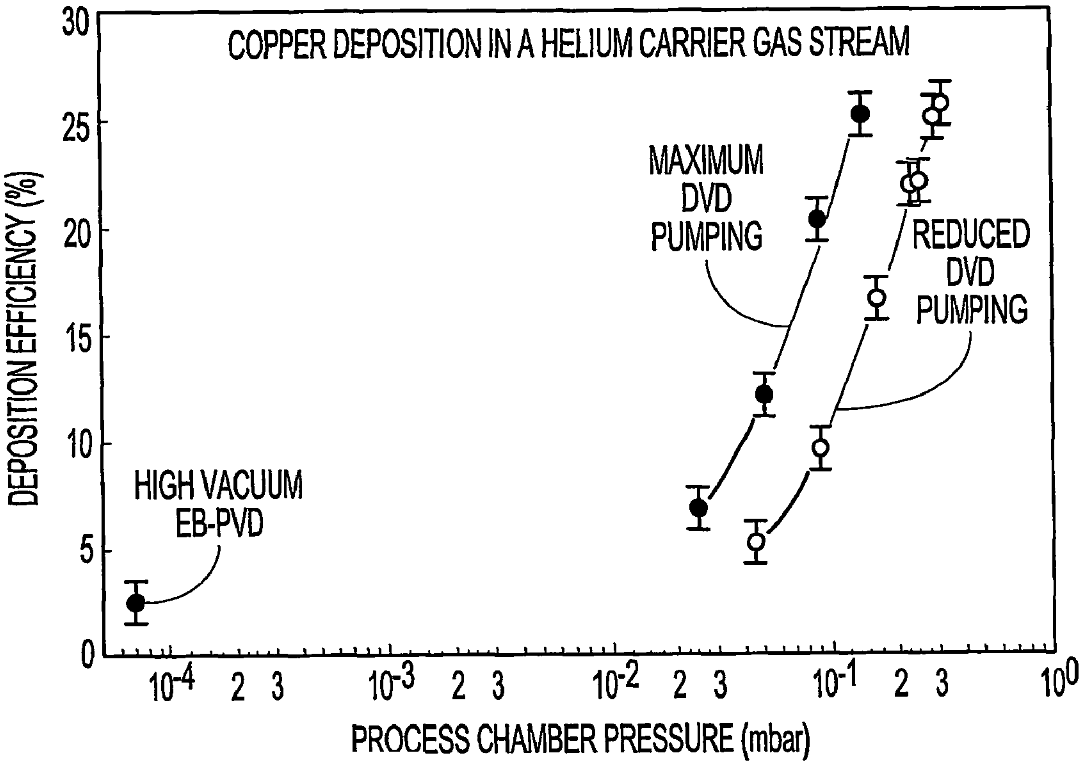
FIG. 6 graphically shows that the DVD II can operate as an EB-PVD (no gas flow, high vacuum) or DVD coater (gas flow); under DVD conditions, the system deposits up to ten times more vapor.

Turning to FIG. 6, recent experimental work with the DVD II system has shown that the deposition efficiency is greatest at the highest chamber pressure. These conditions still yield a non-uniform thickness profile and may result in vapor phase clustering. FIG. 6 graphically shows that DVD II system can operate as an EB-PVD (no gas flow, high vacuum) or DVD coater (gas flow). Under EB-PVD conditions, DVD deposits just 2.5% of its vapor onto a 5.08 cm diameter substrate located 16.8 cm from the vapor source. Under DVD conditions, the system deposits up to ten times more vapor. The thickness profile may be improved by translating the component. However, when high pressure/high gas flow rate conditions exist, the vapor distribution is strongly dependent on the geometry of the component. When nonplanar components (i.e. turbine blades) are to be coated, uniform coatings may still be difficult to obtain.

Applicants set forth herein that in order to achieve a relatively dense, uniform coating, a lower chamber pressure (greater than 13 Pa) is required. In addition, a higher deposition efficiency than the 25-35 percentage reported in FIG. 6 can be obtained.

Figure 7A:
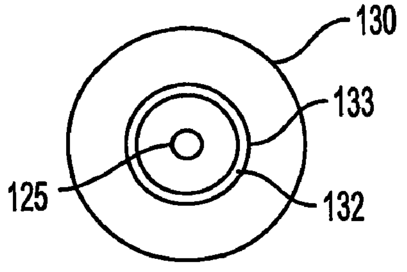
FIGS. 7(A)-7(B) and 7(C)-(D) schematically show nozzle configurations for a DVD system having a present invention ring nozzle configuration and a conventional circular nozzle, respectively.
Figure 7C:
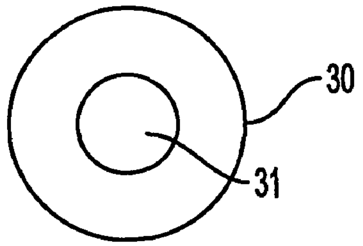
Figure 7B:
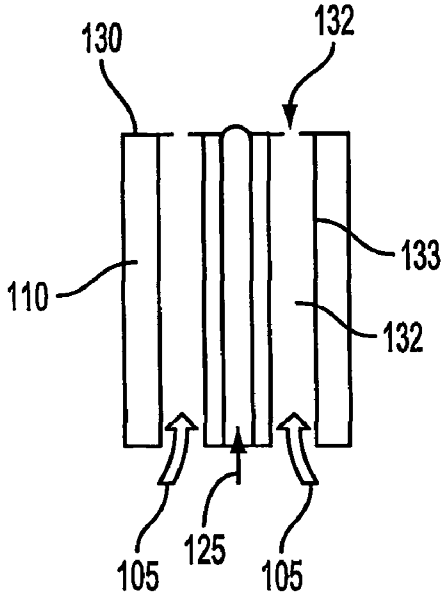
Figure 7D:
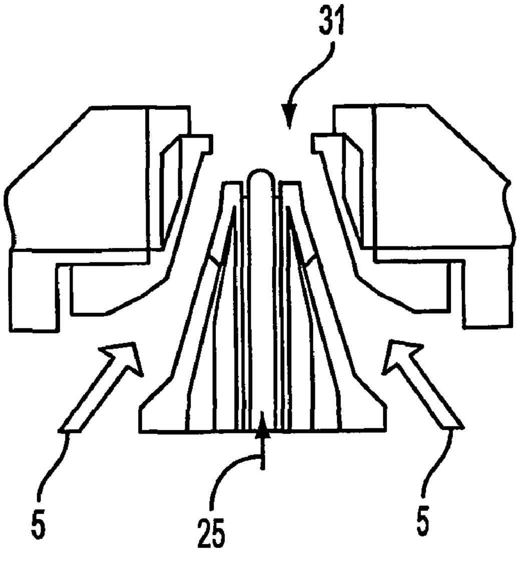

In a second aspect of the present invention, to achieve increased efficiency, the nozzle opening or nozzle gap is redesigned so that a more optimal carrier gas speed distribution for focusing the vapor is produced. As shown in FIGS. 7(A)-7(B), this is obtained by using a converging/diverging nozzle 130 with a ring shaped nozzle opening or gap 132 instead of a conventional circular shaped opening 31, as shown in FIGS. 7(C)-7(D). The present invention design redistributes the carrier gas speed so that higher speeds are achieved away from the axis of symmetry where it is needed most to focus the vapor. Additionally, the area of the nozzle opening or gap 132 for the ring configuration is much smaller than for a circular shaped opening in the conventional design. Therefore higher pressure ratios in the present invention (and in turn carrier gas speeds) can be obtained for the same pumping capacity and gas flow rate setup. The ring shaped opening nozzle allows for a deposition efficiency onto a 5.08 cm wafer of 90 percent even at very low chamber pressures (e.g., 9 Pa). Similar chamber pressures for the conventional circular nozzle yield a deposition efficiency of only 15 percent.

Figure 8A:
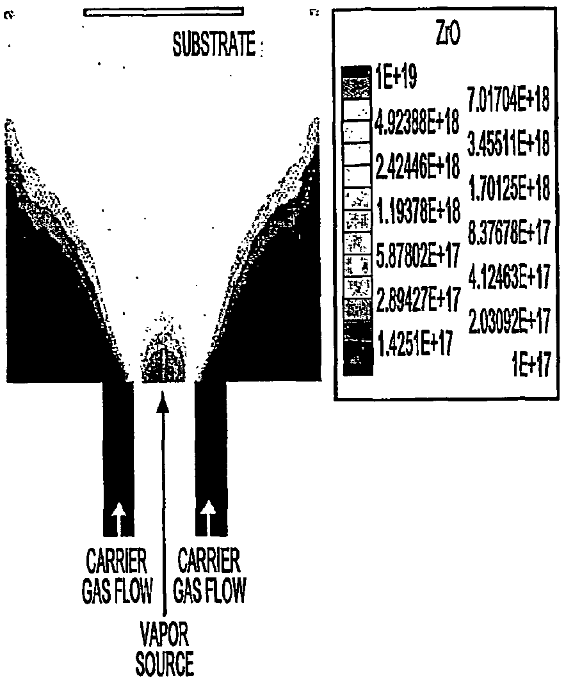
FIG. 8 shows DSMC simulations using the present invention ring nozzle with a chamber pressure of 8 Pa and a gas flow rate of 2.0 standard liters per minute (slm) helium; the ring nozzle effectively focuses the vapor and results in increased deposition efficiency.
Figure 8B:
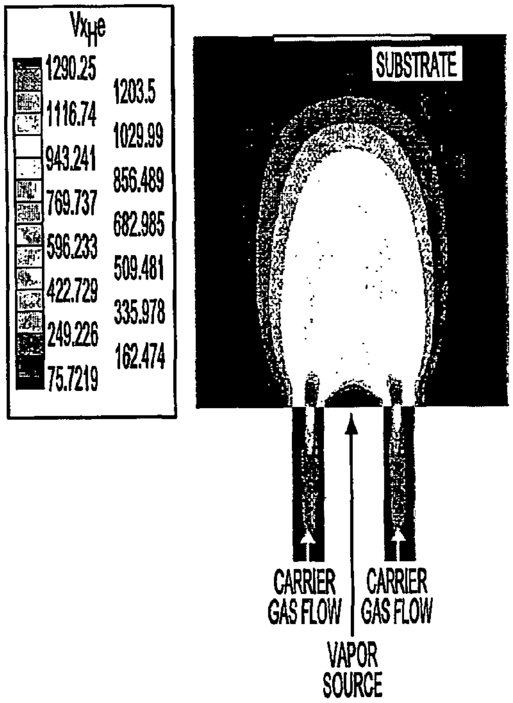
Figure 8C:
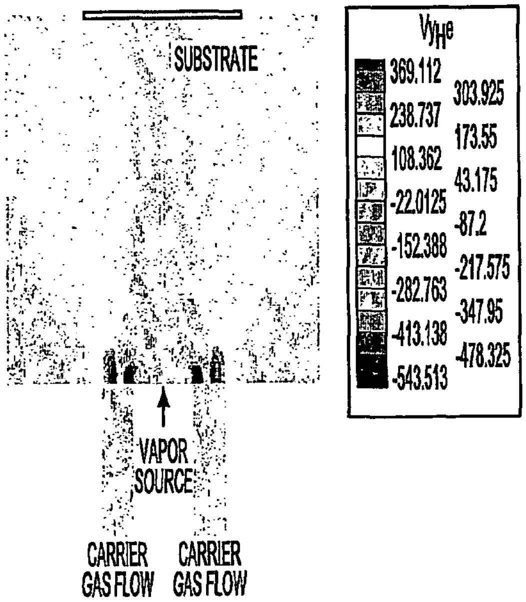
Figure 8D:
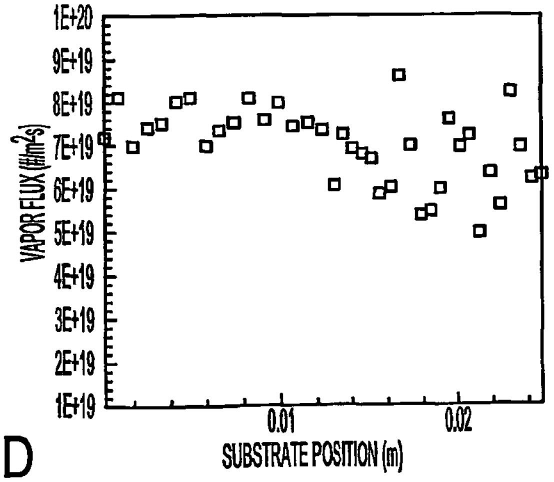
Figure 9A:
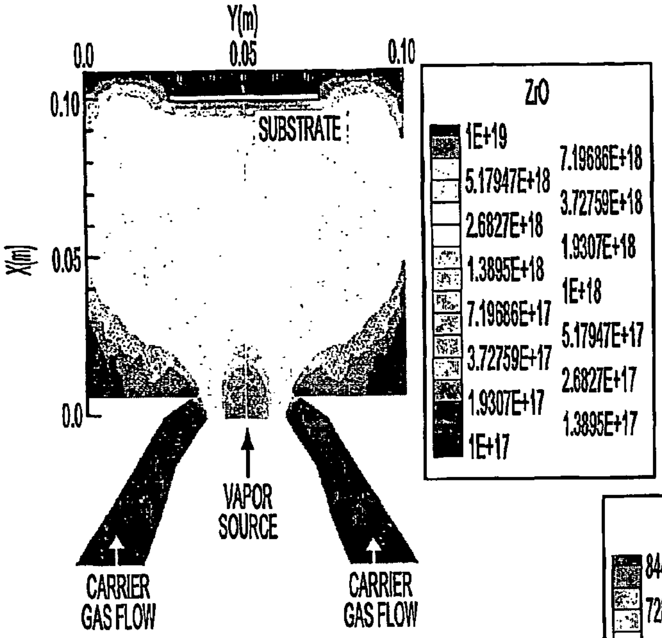
FIG. 9 shows DSMC simulations using the conventional circular nozzle with a chamber pressure of 8 Pa and a gas flow rate of 2.0 slm helium; the vapor flux is less focused using this nozzle, which results in a lower deposition efficiency (15%) than the ring nozzle.
Figure 9B:
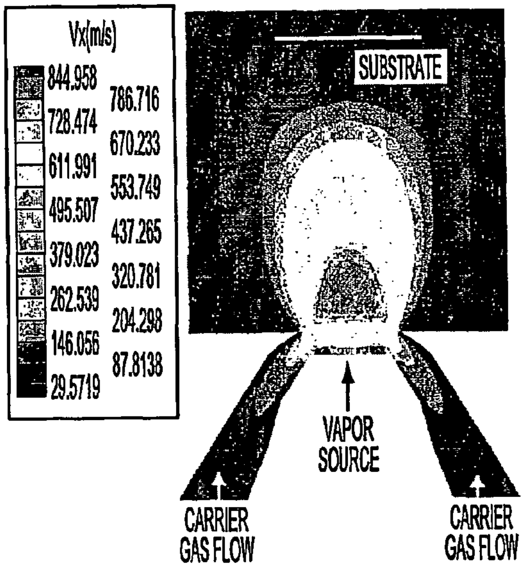
Figure 9C:
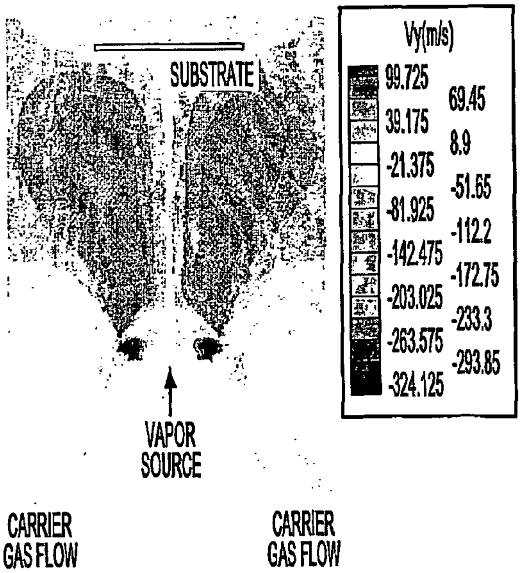
Figure 9D:
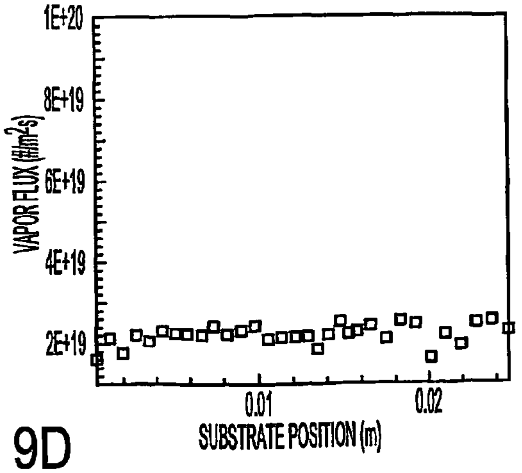
Figure 10A:
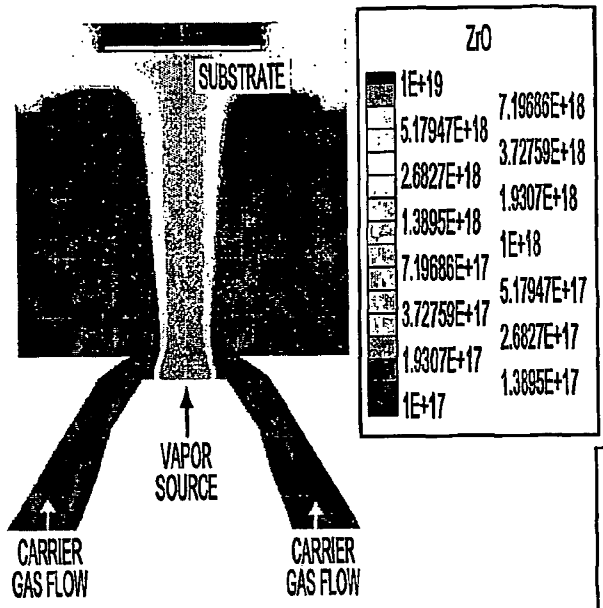
FIG. 10 shows DSMC simulations using the conventional circular nozzle with a chamber pressure of 40 Pa and a gas flow rate of 15.0 μm helium; the vapor flux is well focused due to the high chamber pressure and gas flow rate, however, a wall jet results, which limits the deposition efficiency to approximately 40 percent and leads to a very non-uniform coating thickness.
Figure 10B:
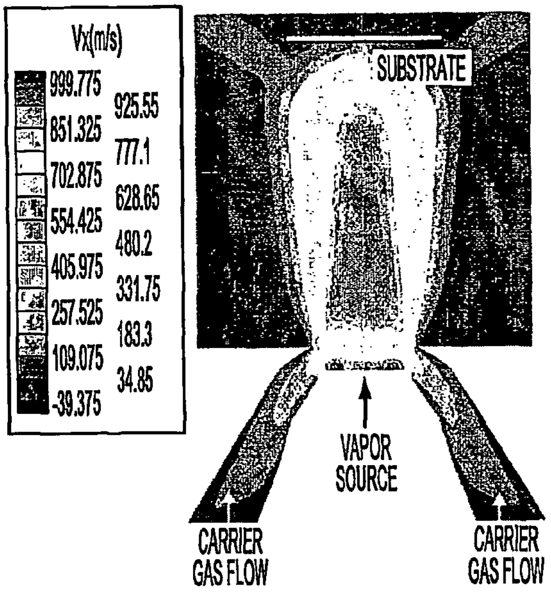
Figure 10C:
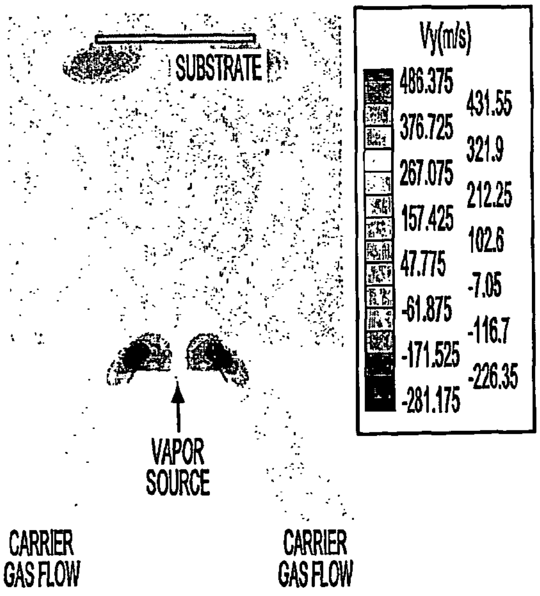
Figure 10D:
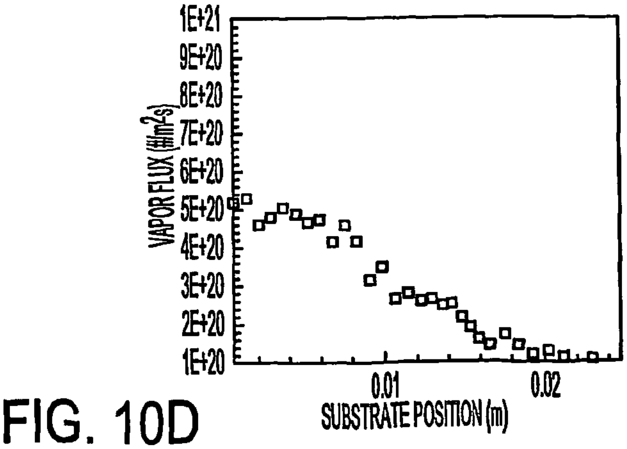

Turning to FIGS. 8-10, according to the low pressure limits wall jet effects as demonstrated by FIGS. 8(C) and 9(C), it is observed from FIGS. 8(D), 9(D) and 10(D) that a more uniform thickness distribution on the substrate is found at lower pressures. FIG. 8 illustrates the DSMC simulations using the present invention ring nozzle (ring-shaped nozzle gap 132) with a chamber pressure of 8 Pa and a gas flow rate of 2.0 slm helium showing: vapor flux density (FIG. 8(A)); speed distribution in the x-direction (FIG. 8(B)); speed distribution in the y-direction (FIG. 8(C)); and coating thickness distribution across a substrate (FIG. 8(D)). The ring nozzle effectively focuses the vapor and results in a deposition efficiency of 90 percent when a 2.0 inch diameter substrate is used. It is noted that only a weak wall jet is present in this case and that a relatively uniform coating thickness results.

FIG. 9 illustrate DSMC simulations using the conventional circular nozzle with a chamber pressure of 8 Pa and a gas flow rate of 2.0 slm helium showing: vapor flux density (FIG. 9(A)); speed distribution in the x-direction (FIG. 9(B)); speed distribution in the y-direction (FIG. 9(C)); and coating thickness distribution across a substrate (FIG. 9(D)). It is noted that the vapor flux is less focused using this conventional nozzle. This results in a lower deposition efficiency (e.g., 15 percent) than the present invention ring nozzle. It is noted that no wall jet was present and a relatively uniform coating thickness resulted.

FIG. 10 illustrates DSMC simulations using the conventional circular nozzle with a chamber pressure of 40 Pa and a gas flow rate of 15.0 μm helium showing: vapor flux density (FIG. 10(A)); speed distribution in the x-direction (FIG. 10(B)); speed distribution in the y-direction (FIG. 10(C)); and coating thickness distribution across a substrate (FIG. 10(D)). The vapor flux was well focused due to the high chamber pressure and gas flow rate, however, a wall jet also resulted limited the deposition efficiency to approximately 40 percent. The wall jet also led to a very non-uniform coating thickness.

Another advantage of present invention nozzle design is that it may be used with larger source sizes without the need for adding significantly more pumping capacity. The pumping capacity required for DVD is a function of the nozzle opening area. Larger openings require more pumping capacity in order to reach the same chamber pressure than smaller openings. Additionally, as the source size is increased, the nozzle opening size must be increased, and this is true for both configurations. However, the area increase for the present invention ring configuration is much less than for the conventional circular shaped opening. For example, if one assumes that increasing the source size from 0.0127 m to 0.0381 m requires a three fold increase in the nozzle diameter, the increased nozzle opening area can be calculated for both configurations. It is found that the circular opening would have a nine fold increase in area while the ring opening would have only a 2.76 fold increase. Thus, a significant savings in the required pumping capacity and gas flow costs is achieved. The benefit of increasing the source size is that the vapor emitting surface would be increased by nine fold, and in conjunction with the 3 to 4 time improvement in the deposition efficiency, could lead to a deposition rate which is more than 30 times higher than current DVD technology (i.e., greater than 500 μm/min. is then possible based on current deposition rates (of 15 to 20 μm/min.)).

Multiple Blade Coating

A third aspect of the present invention method and system, is directed at the capability to "steer" vapor flux from the nozzle by changing the pressure in the nozzle on either side of the vapor source.

Figure 11:
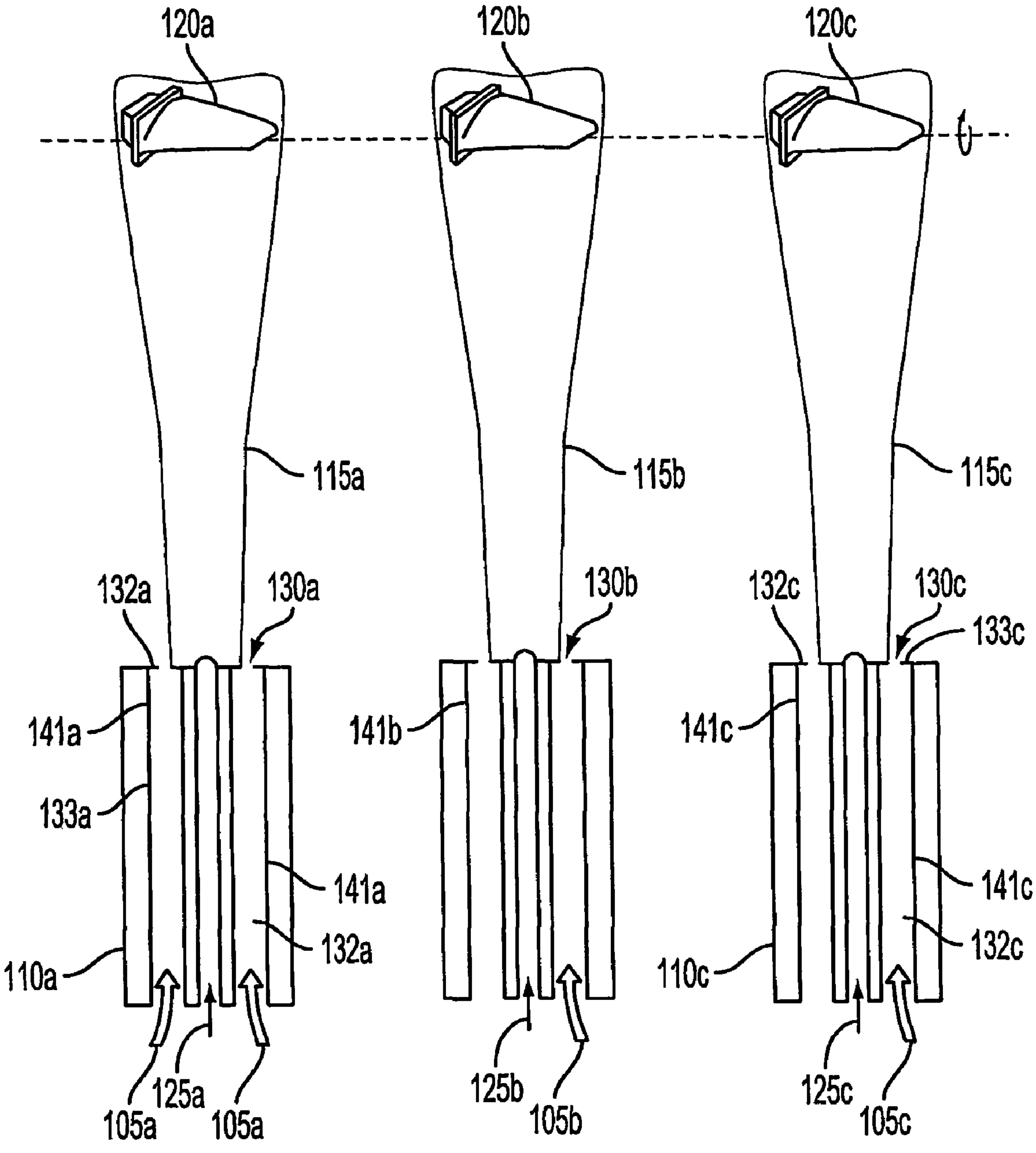
FIG. 11 is a schematic illustration showing a multiple crucible and multiple jet arrangement, in which each source is heated with an electron beam (using either beam scanning or multiple e-beam guns) and the vapor is directed onto a turbine blade or blades at high efficiency and rate.

A fourth aspect of the present invention, as shown in FIG. 11, is directed at coating several blades at one time. It is often desirable to coat several blades at one time within the deposition chamber. This embodiment allows for using a number of sources (125(*a*), 125(*b*), 125(*c*)), carrier gas streams (105(*a*), 105(*b*), 105(*c*)), and nozzles (130(*a*), 130(*b*), 130(*c*)) to focus vapor onto individual components. FIG. 11 is a schematic illustration showing a multiple crucible/jet arrangement. In a preferred embodiment, the nozzles include nozzle gaps 132(*a*), 132(*b*), 132(*c*) where carrier gas streams flow therefrom. The nozzle gaps are non-angular 141(*a*), 141(*b*), 141(*c*) having a ring-shape 133(*a*), 133(*b*), 133(*c*). Each source is heated with an electron beam (using either single beam scanning gun or multiple e-beam guns) and the vapor is directed onto a turbine blade at high efficiency and rate. In this case shown, the vapor flux distribution (115(*a*), 115(*b*), 115(*c*)), is adjusted to the size of the blade or target (120(*a*), 120(*b*), 120(*c*)). This allows multiple blades or targets to be simultaneously coated at high rate to result in a very high process throughput. Steering of the vapor is accomplished using non-angular symmetric nozzles. In one approach, an additional electron beam 103 is employed for each source 105. A preferred method is to use the high frequency scanning capability of the electron beam to maintain evaporation from many sources simultaneously.

Figure 12:
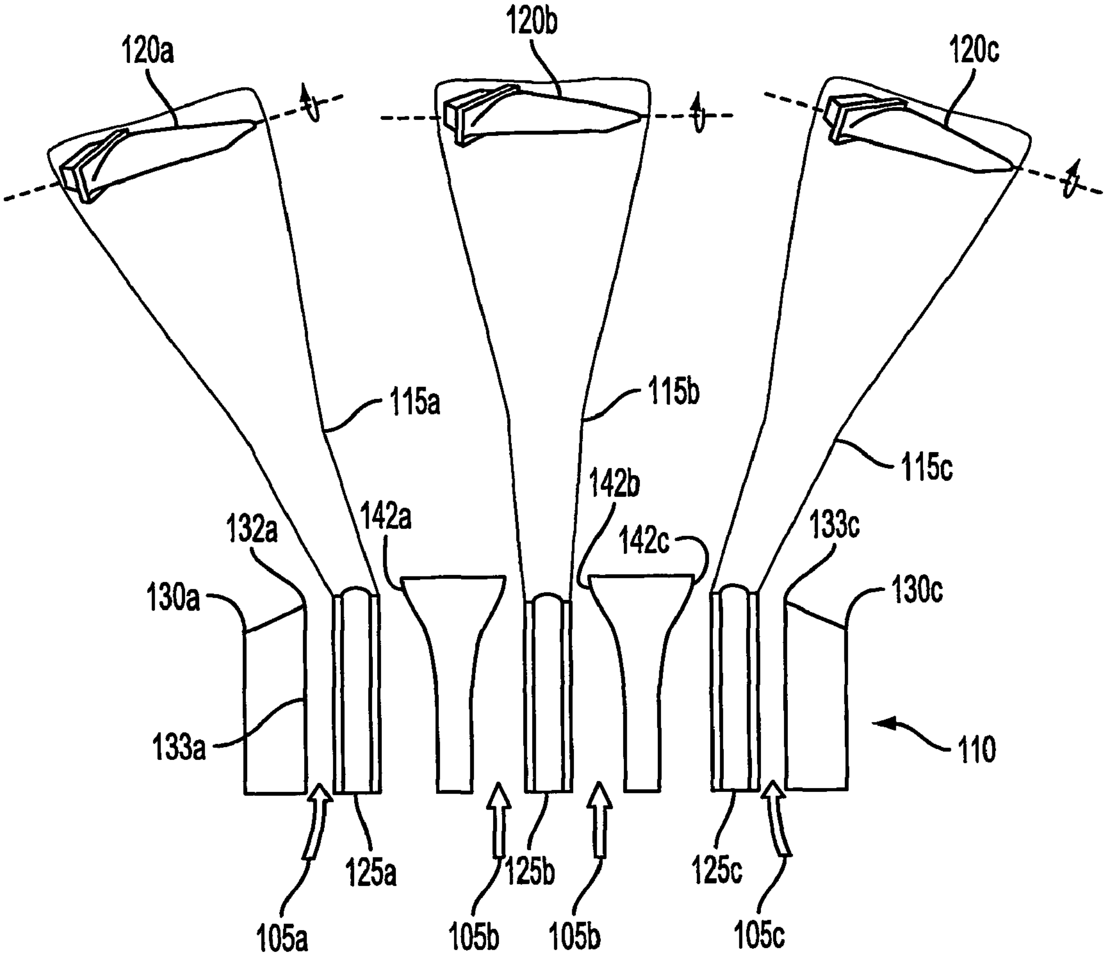
FIG. 12 is a schematic illustration showing a multiple nozzle per crucible configuration in which nozzles can be closely spaced so that one electron beam can be scanned across each source for simultaneous heating, and the orientation of the nozzle openings can be altered to steer the flux onto widely spaced components.

Turning to FIG. 12, a fifth aspect of the present invention allows for steering of the vapor using angular symmetric nozzles defined by angular channels 142(*a*), 142(*b*), 142(*c*). In this configuration, multiple sources 125(*a*), 125(*b*), 125(*c*), carrier gas streams 105(*a*), 105(*b*), 105(*c*), and nozzles 130(*a*), 130(*b*), 130(*c*) are employed to steer the vapor flux onto widely spaced individual components. The schematic illustration of this embodiment shows a multiple nozzle per crucible configuration in which nozzles are closely spaced so that one electron beam can be scanned across each source for simultaneous heating. The orientation of the nozzle openings are altered to steer the flux onto widely spaced components (e.g., targets/substrate).

Figure 13:
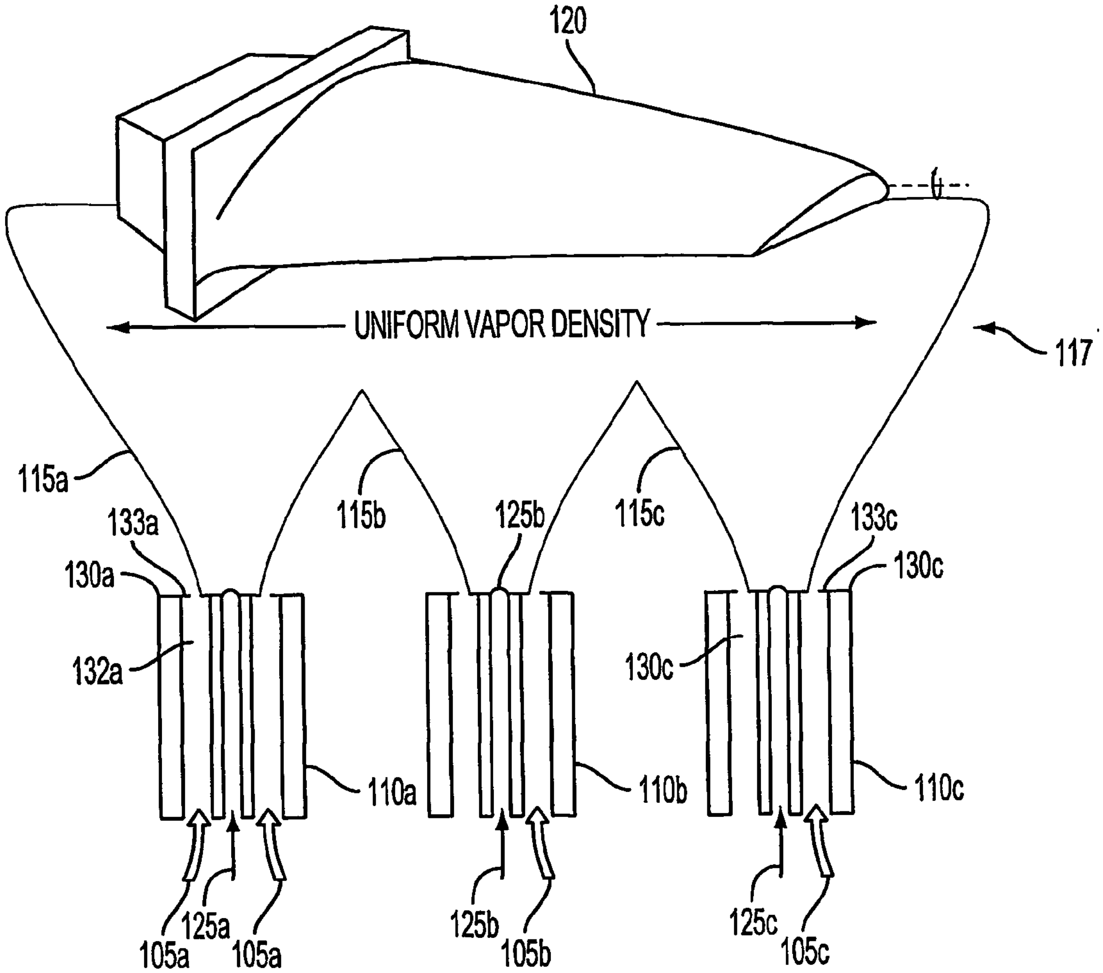
FIG. 13 is a schematic illustration of the use of multiple sources to moderately focus a vapor flux, which results in a large uniform vapor flux distribution and allows for the uniform coating of large turbine blades such as those used in industrial power generation turbines.
Figure 14:
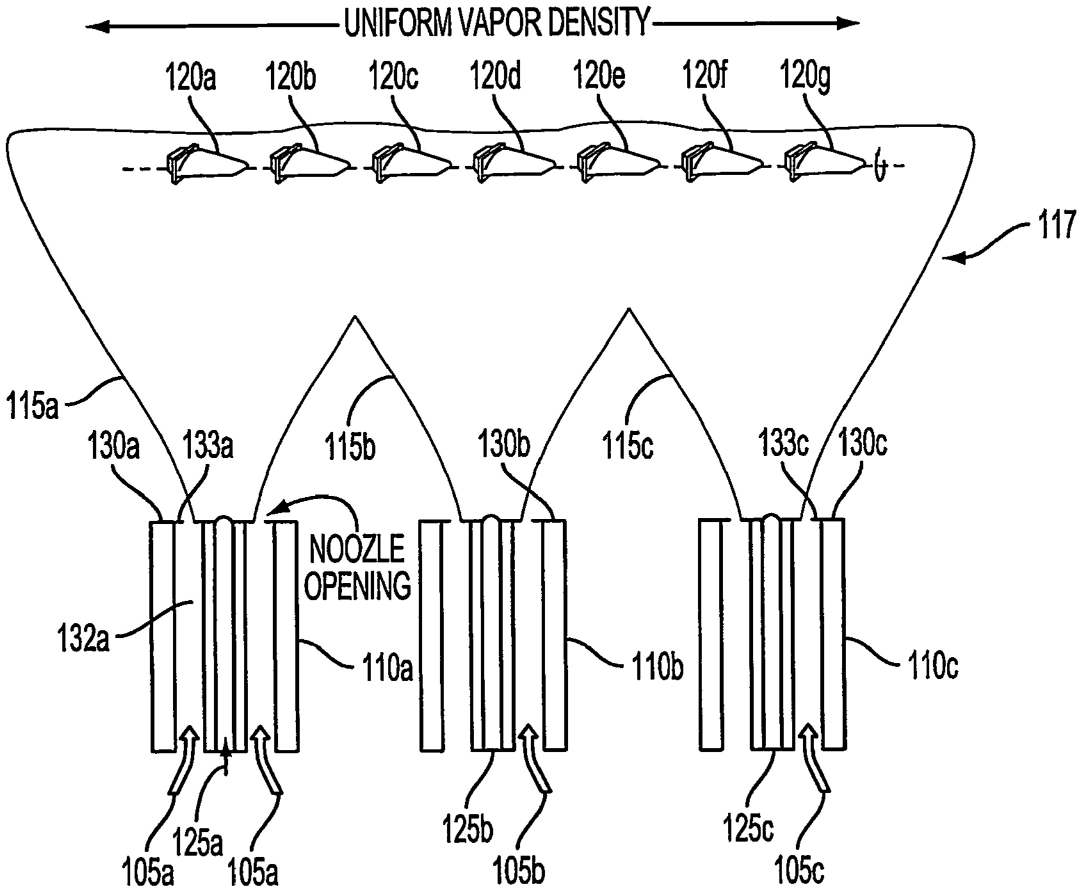
FIG. 14 is a schematic illustration showing the use of a multiple crucible/jet arrangement in which a vapor flux is focused to result in a large uniform vapor flux distribution such that a large number of small turbine blades can be placed into the vapor and be uniformly coated at moderately high efficiency and rate.

Turning to FIGS. 13 and 14, in a sixth aspect of the present invention, multiple sources (125(*a*), 125(*b*), 125(*c*)), carrier gas streams (105(*a*), 105(*b*), 105(*c*)), and nozzles (130(*a*), 130(*b*), 130(*c*)) to create one large, uniform vapor cloud in which blades can be placed. Referring to FIG. 13, this embodiment uses multiple sources to moderately focus a vapor flux, which results in a large uniform vapor flux distribution 117 and allows for the uniform coating of large turbine blades such as those used in industrial power generation turbines.

Turning to FIG. 14, this embodiment uses multiple crucibles and jets arrangement in which a vapor flux is focused to result in a large uniform vapor flux distribution 117 such that a large number of small turbine blades can be placed into the vapor and be uniformly coated at moderately high efficiency and rate. An advantage of this approach is that less carrier gas flow is required while more blades per coating cycle may be coated. The proper approach is dependent on the size of the blades being coated. This approach may be appropriate when blades which are much smaller or larger than the uniform area of a individual jet.

Figure 15A:
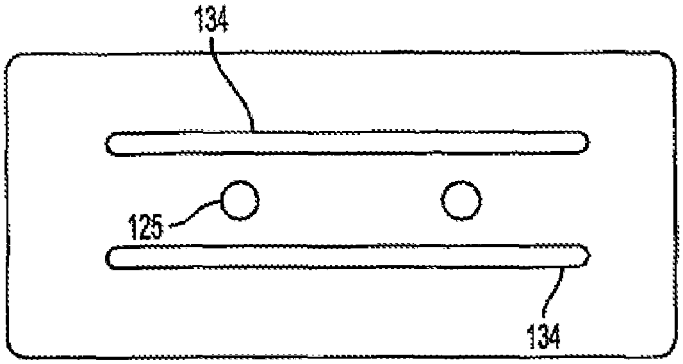
FIG. 15 is a schematic illustration showing a nozzle configuration consisting of elliptical nozzles, in which the elongated nozzle openings (gaps or channels) are used to focus the vapor flux along one direction, which results in an elliptical vapor flux distribution.
Figure 15B:
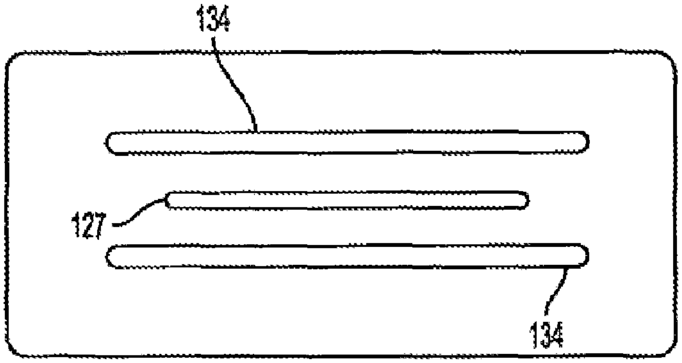
Figure 15C:
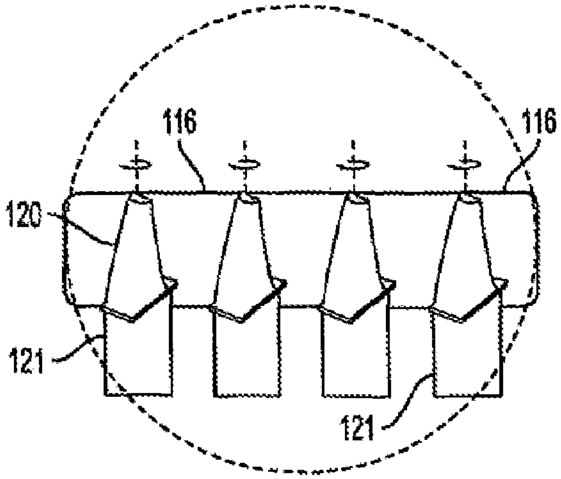

As discussed above, it is also recognized that nozzle shapes other than ring-shaped may be useful. As shown in FIGS. 15(A)-15(C), in a seventh aspect of the present invention, alternative embodiments utilize elongated elliptical ring gaps 134 and, optionally elongated elliptical source openings 127, to produce an elliptical vapor flux 116 distribution. This is of interest for non-circular shaped substrates such as turbine blades 120, in which a higher deposition efficiency can be realized if the shape of the vapor flux distribution is tailored to the size and shape of the part to be coated This approach allows for one to not only apply a coating to the desired area of the part, but also to prevent coating on an area that requires subsequent part manipulation tooling or locations 121 on the part which do not require a turbine blade. The dashed lines shown in FIG. 15(C) indicate a circular vapor flux compared to the desirable elliptical vapor flux 116 distribution of the present invention. The circular case would result in a larger portion of the vapor not being utilized.

Figure 18A:
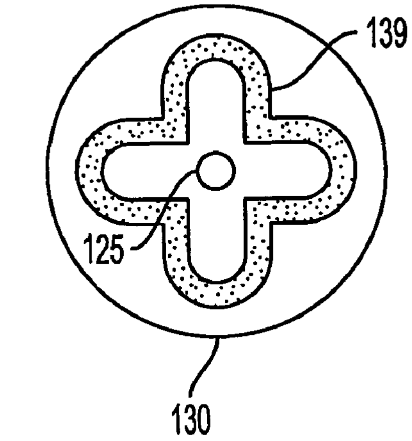
FIGS. 18(A)-18(E) are schematic illustrations showing alternate embodiment of the nozzle ring gaps and source having various shapes and respective alignment.

As an eighth aspect of the present invention and as referred to above, the nozzle gaps and source shapes may be of a variety of shapes, alignments, and quantity. For example, FIG. 18(A) schematically shows the plan view of a cross-hatch-shaped nozzle gap 139 in relation to the nozzle 130 and source 125.

Figure 18B:
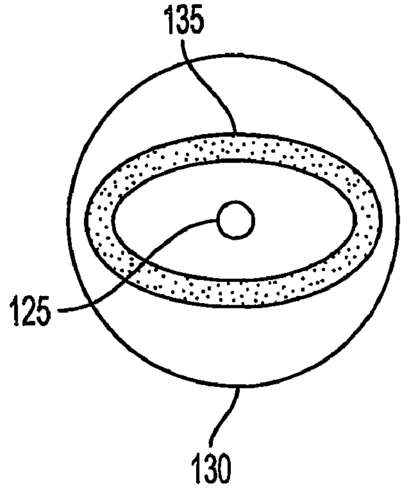

Next, FIG. 18(B) schematically shows the plan view of an elliptical-shaped nozzle gap 135 in relation to the nozzle 130 and source 125.

Figure 18C:
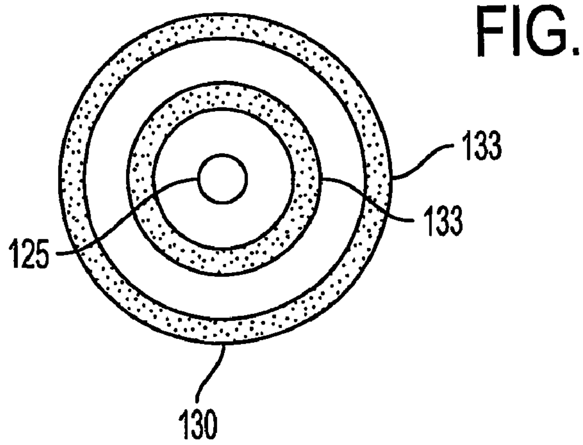

Next, FIG. 18(C) schematically shows the plan view wherein the ring-shaped nozzle gaps 133 (at least two or more) are concentric or substantially concentric.

Figure 18E:
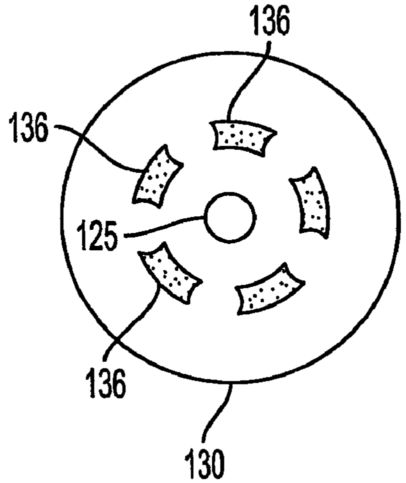
Figure 18D:
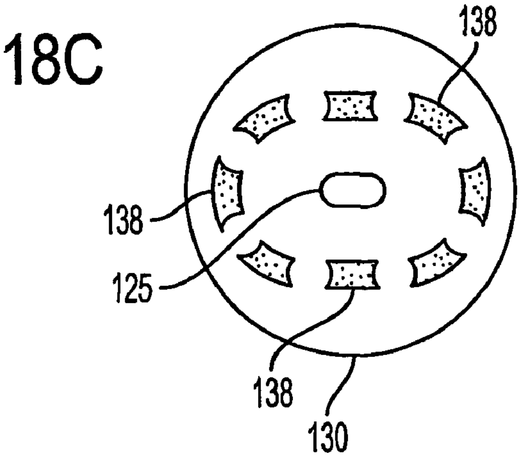

Moreover, as shown in FIGS. 18(D) and 18(E), the ring gaps or channels may be partitioned so that a plurality of segments comprise the overall gap or channel. FIGS. 18(D) and 18(E) schematically show the plan view of a segmented elliptical 138 and segmented ring gap 136.

Composition Control

Another advantage of using a DVD method is the ability to control the composition of the deposited coating. This can be important as both the insulating top layer and the bond coat layer of a thermal barrier coating are multicomponent coatings. Efforts to deposit multicomponent coatings directly can be challenging because the vapor cloud is not the same composition as the source when the vapor pressures of the components differ by more than a factor of 1000 at the surface temperature of the vapor emitting surface [21]. In such cases, the composition of the resulting coatings can differ greatly from that of the source and varies with deposition time [22].

In material systems where large vapor pressure differences exist between the precompounded oxide source components (for example $Y_2O_3$—$CeO_2$), multiple source evaporation from individual metal oxide sources is required to deposit a coating with the desired composition. In these cases, reactive deposition from a metal alloy source can sometimes provide an alternative to precompounded oxide evaporation since the vapor pressure differences between metallic alloy components can be significantly different than that of their oxides. For example, there is only a difference of a factor of three in the vapor pressures of Ce and Y at 2500° C. In such cases, multi-component oxide coatings can be produced using a binary alloy which is stoichiometrically evaporated. In principle, this enables one to avoid multiple source evaporation and can expand the range of the complex oxides, which can be deposited using EB-PVD techniques.

In conventional (high vacuum) EB-PVD processes, vapor phase collisions are rare. When reactive deposition is employed, the vapor components are absorbed onto the substrate before the gas phase reactions occur. Under these conditions, Ritter et al. [23] has shown that the ratio of the number of substrate collisions of the reactive gas to the evaporated material, $V_a/V_b$, must be high (i.e greater than $10^2$) in order to obtain a non-reduced film. Thus, the partial pressure of the reactive gas must increase with the deposition rate to maintain an adequate impingement of oxygen onto the substrate. As a result, the chamber pressure must increase with deposition rate. However, conventional EB guns need to operate in a high vacuum to successfully generate and maintain a high density electron beam, and this constrains the deposition rate of the process. This problem can be partially overcome either by using a high pressure EB-PVD process or employing plasma activation. Increased chamber pressures not only allows for a high oxygen:metal ratio, but also controls vapor phase collisions. At increased pressures, the reaction can occur both during vapor transport and at the substrate. In plasma activation, ionization of the reactive and metal vapor increases the collisional cross section of the reactants to promote vapor phase collisions and reactions without increasing the chamber pressure [22].

Recently, a high pressure, electron beam directed vapor deposition (DVD) process, has been developed [17]. It combines high rate, low vacuum electron beam evaporation with a rarefied gas jet to entrain the vapor and transport it to a substrate. The approach uses the combination of a continuously operating, high voltage (60 kV) e-beam gun (modified to function in a low vacuum (13.3 to 665 Pa) environment) and a He carrier gas jet. The transonic jet is produced by maintaining a high pressure upstream of the jet nozzle opening that is at least twice that of the downstream chamber pressure. During operation, a source material is vaporized and the carrier gas jet collides (at high velocity) with the vapor, entraining and directing it towards the substrate. Binary collisions in the flow cause the vapor to be scattered toward the substrate where it condenses. By entraining all the vapor in a small (approximately 3 cm) diameter jet a high fraction of the evaporated flux can be deposited and high local deposition rates are achievable, even with moderately low power (10 kW) electron beam guns [18]. By adding oxygen to the gas flow and manipulating the pressures, the flux of reactive gas atoms entering the chamber can be controlled. This allows the metal vapor/carrier gas mean free path to be altered and thus the vapor-oxygen collision frequency can be controlled. The process has been used successfully to create zirconia and yttria-stabilized zirconia coatings from precompounded oxide sources [20].

A variety of metal sources (such as Zr, Al, Y etc.) can also be evaporated. If oxygen is present in the carrier gas, the evaporated metal atoms have an opportunity to react with the reactive component of the carrier gas flow (either in the vapor phase or at the substrate) to create an oxide coating.

The present invention process is superior to conventional EB-PVD for reactive deposition (e.g., reactive component of the carrier gas flow) in several ways. First, the low vacuum environment increases the vapor phase collision rate and is likely to promote reactions during vapor transport. The present invention process also allows a sufficient supply of reactive gas for high rate deposition. Second, carrier gas/vapor atom interactions with the electron beam result in higher fractions of ionized species which further increases the reaction probability. Third, the high kinetic energy of the carrier gas and vapor atoms (a result of the supersonic expansion of the carrier gas) may assist reaction barrier activation [18]. These factors of the present invention enhance the reaction probability between the reactants and lead to a more favorable environment for reactive deposition. One objective of the present invention is to provide the utility of the DVD process for creating a simple (single) metal oxide from a metal source. Multicomponent oxides could then be made using a single alloy source provided the vapor pressure constraints above apply.

Figure 16:
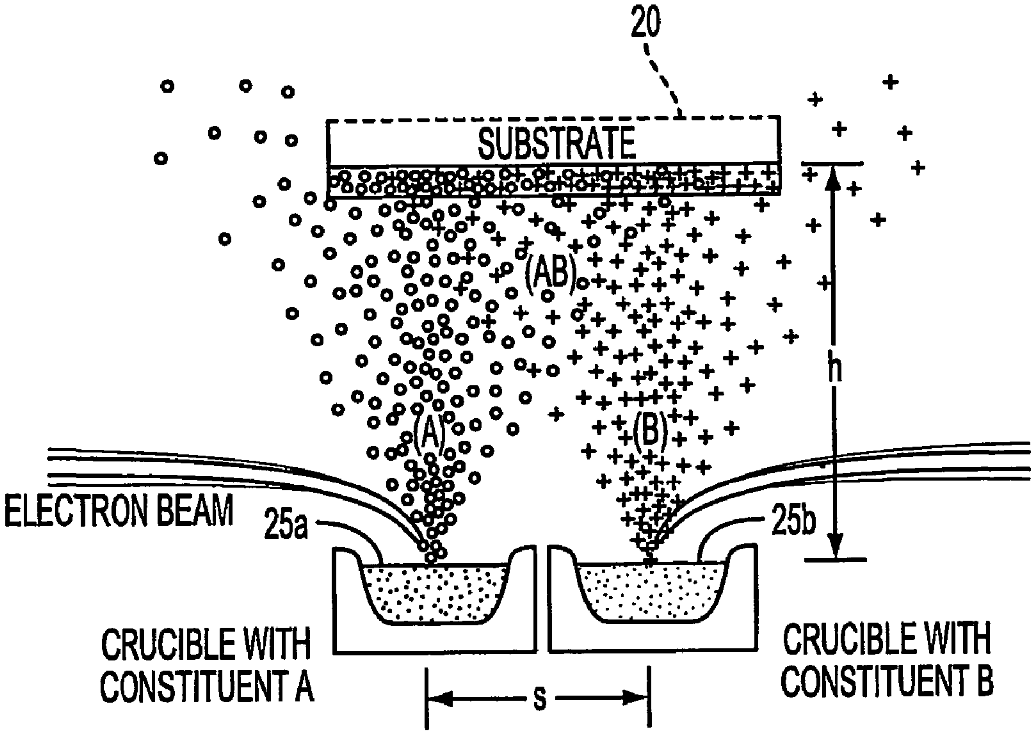
FIG. 16 is a schematic illustration showing the use of a two crucible arrangement for alloy deposition using conventional electron beam evaporation.

On the other hand, for instances where a single alloy is not applied, materials must be evaporated from two or more sources using either a single or multiple electron beam gun arrangement. As shown in FIG. 16, in a conventional EB-PVD configuration, the film composition is strongly dependent on the position of the sources and the substrate position.

The compositional uniformity and region of vapor mixing can be maximized when the source spacing, s, is small and the source to substrate distance, h, is large. However, such a configuration is often not advantageous as large source to substrate distances lower the materials utilization efficiency (MUE, the ratio of evaporated atoms which deposit onto the substrate) and the use of a small source size leads to reduced evaporation rates. This is not conducive to high rate deposition and is significantly more costly than single source evaporation [22]. Improved multisource deposition approaches are therefore desired which yield compositionally uniform vapor fluxes and a high process efficiency are therefore desired.

Figure 17:
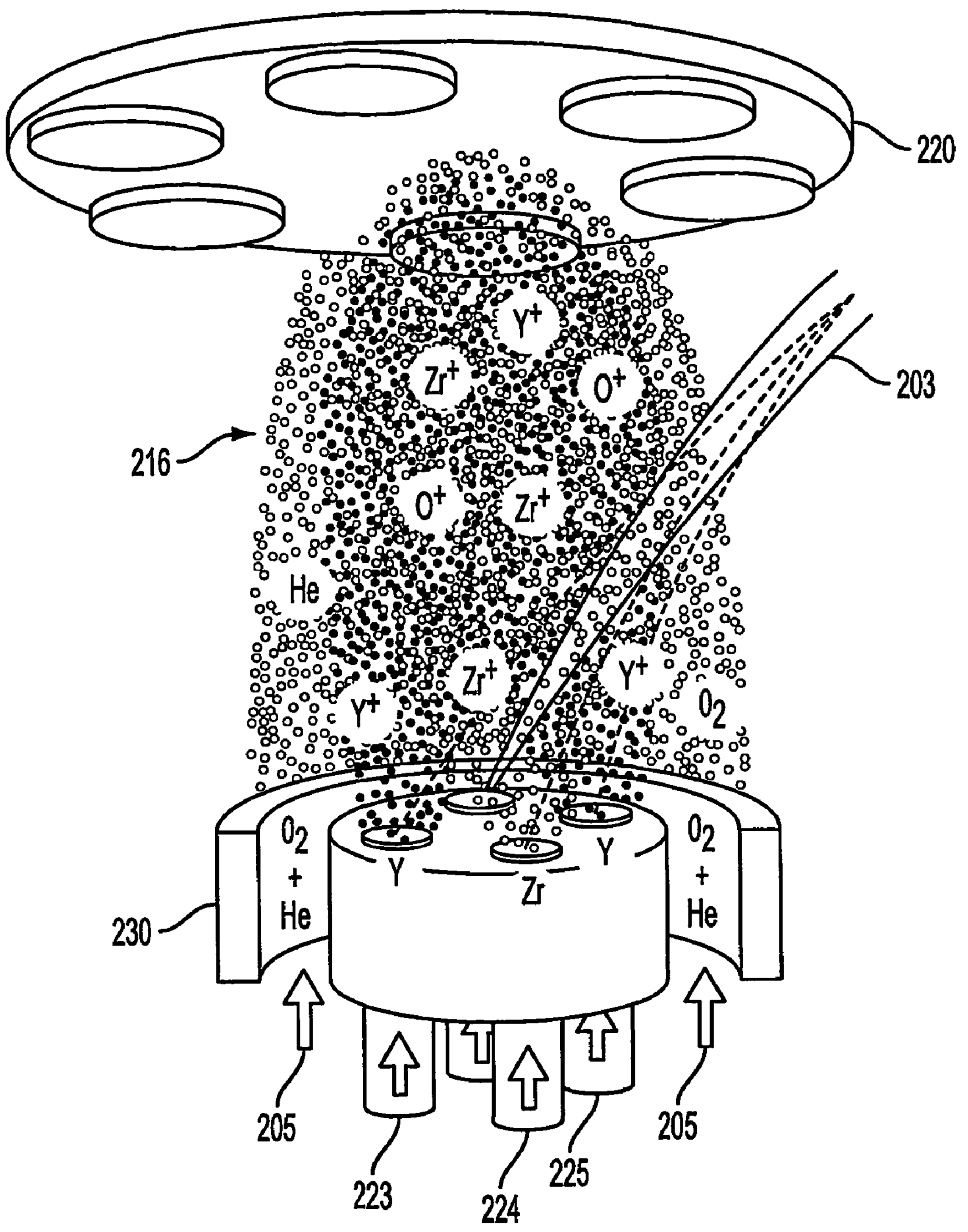
FIG. 17 is a schematic illustration of the present invention showing the use of multiple source evaporation in directed vapor deposition.

As a ninth aspect of the present invention, as illustrated in FIG. 17, there is provided an alternative embodiment, wherein vapor phase mixing can be achieved by aligning two (or potentially more) sources 223, 224, 225 in line with a carrier gas flow 205 and using electron beam scanning 203 to uniformly heat both (or plurality of) sources. The use of the carrier gas jet in this embodiment not only scatters the vapor flux toward the substrate, leading to a potentially high MUE (and high deposition rates), but also randomizes the vapor trajectory facilitating vapor phase mixing of the two (or plurality of) fluxes 216. A high MUE would allow for the use of small diameter metal source materials, which could be spaced closely together to further improve the compositional uniformity of the coating, while still achieving a high rate of deposition. The composition of the deposited layer could be systematically controlled by altering the electron beam scan pattern to change the surface temperature (and thus the evaporation rate) of each source material.

In conclusion, the present invention describes a series of steps, and an apparatus for use therewith for applying a coating to a substrate using an electron beam directed vapor deposition technique, thereby, for example improving upon the method published by Hass et al. [20].

Some advantages of the present invention process and apparatus, but not limited thereto is that it provides for the materials utilization efficiency of the process to be improved, deposition rate increased, coating uniformity improved, multiple blade coating during each coating cycle, carrier gas flow costs optimized, and blades to be heated to the desired temperature.

Moreover, this invention allows the ratio of carrier gas flow to vapor molecular concentration to be dramatically reduced while increasing the material utilization efficiency of the technology. Accordingly, this breakthrough has significant positive economic implications for the utility of the process.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

REFERENCES

The following references, as cited throughout this document, are hereby incorporated by reference herein in their entirety:

1. S. M. Meier and D. K Gupta, *Trans. of the ASME,* 116, 250 (1994).

2. A. J. Glassmnan, *Turbine Design and Application*, Vol. 3, NASA-SP-290 VOL-3, NASA Lewis Research Center (1975).

3. W. J. Brindley and R. A. Miller, Advanced Materials and Processes, 29 (1989).

4. R. V. Hillery (ed.), *Coatings for High-Temperature structural Materials: Trends and Opportunities*, National Academy Press, Washington D.C. (1996).

5. C. H. Liebert and R. A. Miller, Ind. Eng. Chem. Prod. Res. Dev., 23, 344 (1984).

6. D. Claves and A. Galerie, Journal De Physique IV, C9, 531 (1993)

7. O. Unal, J. Am. Ceram. Soc., 77 [4], 984 (1994).

8. D. Michel L. Mazerolles and M. Perez Y Jorba, J. of Mat. Sci., 18, 2618 (1983).

9. J. T. DeMasi-Marcin, K. D. Sheffler and S. Bose, J. of. Eng. Gas Turbines and Power, 112, 521 (1990).

10. T. E. Stranginan, Thin Solid Films, 127, 93 (1985).

11. U. Schulz, H. Oettel, and W. Bunk, Z. Metallkd., 87, 6 (1996).

12. R. J. Christensen, D. M. Lipkin, D. R. Clarke, and K Murphy, Appl. Phys. Lett., 69 [24], 3754 (1996).

13. M. Y. He, A. G. Evans and J. W. Hutchinson, Mat. Sci. Eng., in press (1997)

14. K. Fritscher et. al., *Advanced Aerospace Materials*, H. Buhl (ed.), Springer-Verlag, Berlin, Heidelberg (1992) pp. 84-107.

15. D. J. Wortman, B. A. Nagaraj and E. C. Duderstadt, Mat. Sci. Eng., A121, 443 (1989).

16. P. Hancock and M. Malik, *Materials for Advanced Power Engineer, Part I*, D. Coutsouradis et. al. eds., Kluwer Academic Publishers, Netherlands (1994) pp.685-704.

17. J. F. Groves and H. N. G. Wadley, Composites B, 28B, 57 (1997).

18. J. F. Groves, Ph. D Thesis, University of Virginia (1998).

19. D. D. Hass, Ph. D. Thesis, University of Virginia (2001).

20. D. D. Hass, P. A. Parrish and H. N. G. Wadley, J. Vac. Sci. Technol., A 16[6] (1998) 339.

21. S. Schiller, U. Heisig and S. Panzer, Electron Beam Technology, (1995).

22. R. F. Bunshah (ed.), Handbook of Deposition Technologies for Films and Coatings, Noyes Publications, Park Ridge, N.J., (1994) p. 131.

23. E. Ritter, J. Vac. Sci. Technol., 3[4] (1966) 225.

We claim:

1. A method for applying at least one coating on at least one substrate comprising:

presenting said at least one substrate to a chamber, wherein said chamber has an operating pressure ranging from about 0.1 to about 32,350 Pa;

presenting at least one evaporant source to said chamber;

presenting at least one carrier gas stream to said chamber;

impinging said at least one evaporant source with at least one electron beam in said chamber to generate an evaporated vapor flux in a main direction toward said substrate;

entraining said at least one generated evaporated vapor flux by said at least one carrier gas stream, wherein said carrier gas stream is essentially parallel to said main direction and substantially surrounds said evaporated flux, wherein said evaporated vapor flux at least partially coats at least one said substrate, and wherein:

said at least one carrier gas stream is generated from said at least one nozzle and said at least one evaporant source is disposed in said at least one nozzle, wherein at least one said nozzle comprises: at least one nozzle gap wherein said at least one said carrier gas flows therefrom;

wherein at least one said nozzle gap is defined by a shape selected from the group consisting of: ring-shaped, elliptical-shaped, elongated elliptical-shaped, cross-hatch-shaped, segmented ring-shaped, segmented elliptical-shaped, and segmented elongated elliptical-shaped; and at least one evaporant retainer for retaining at least one evaporant source, said evaporant retainer being at least substantially surrounded by at least one said nozzle gap.

2. The method of claim 1, wherein said evaporant retainer is a crucible.

3. The method of claim 1, further comprising:

providing a plurality of said nozzles, wherein said nozzle gaps being non-angular channels; and providing a plurality of said electron beams, wherein individual said electron beams impinges on individual said sources to generate evaporated vapor flux to at least partially coat a plurality of said substrates, each of said substrates being coated respectively from a singular said evaporant source.

4. The method of claim 1, further comprising:

providing a plurality of said nozzles, wherein said nozzle gaps being non-angular channels; and providing a plurality of said electron beams, wherein individual said electron beams impinges on individual said sources to generate an evaporated vapor flux to at least partially coat a singular said substrate, said substrate being coated from said plurality of said evaporant sources.

5. The method of claim 1, further comprising:

providing a plurality of said nozzles, wherein said nozzle gaps being angular channels; and providing a singular said electron beam, wherein said electron beam impinges on individual said sources to generate evaporated vapor flux to at least partially coat a plurality of said substrates, each of said substrates being coated respectively from a singular said evaporant source.

6. The method of claim 1, further comprising:

providing a plurality of said nozzles, wherein said nozzle gaps being angular channels; and providing a singular said electron beam, wherein said singular electron beam impinges on individual said evaporant sources to generate an evaporated vapor flux to at least partially coat a singular said substrate, said substrate being coated from said plurality of said evaporant sources.

7. The method of any one of claims 3, 4, 5, or 6, wherein said evaporant sources have substantially the same chemical composition relative to one another.

8. The method of any one of claims 3, 4, 5, or 6, wherein at least one of said evaporant sources have different chemical compositions relative to one another.

9. The method of claim 8, further comprising:

combining at least two of said evaporant sources after impingement but prior to reaching said substrates.

10. The method of claim 1, wherein at least one said nozzle comprises a converging/diverging nozzle.

11. An apparatus for applying at least one coating on at least one substrate comprising:

a chamber, wherein said chamber has an operating pressure ranging from about 0.1 to about 32,350 Pa, wherein at least one of said substrates is presented in said chamber;

at least one evaporant source disposed in said chamber;

at least one carrier gas stream provided in said chamber; and at least one electron beam, said electron beam: impinging at least one said evaporant source with at least one said electron beam in said chamber to generate an evaporated vapor flux in a main direction toward said substrate; wherein said at least one carrier gas stream entrains said at least one generated evaporated vapor flux, wherein said carrier gas stream is essentially parallel to the main direction and substantially surrounds said evaporated flux, wherein said evaporated vapor flux at least partially coats at least one said substrate, and wherein:

said at least one carrier gas stream is generated from said at least one nozzle and said at least one evaporant source is disposed in said at least one nozzle, wherein at least one said nozzle comprises: at least one nozzle gap wherein said at least one said carrier gas flows therefrom;

wherein at least one said nozzle gap is defined by a shape selected from the group consisting of: ring-shaped, elliptical-shaped, elongated elliptical-shaped, cross-hatch-shaped, segmented ring-shaped, segmented elliptical-shaped, and segmented elongated elliptical-shaped; and at least one evaporant retainer for retaining at least one said evaporant source, said evaporant retainer being at least substantially surrounded by at least one said nozzle gap.

12. The apparatus of claim 11, wherein said evaporant retainer is a crucible.

13. The apparatus of claim 11, further comprising:

a plurality of said nozzles, wherein said nozzle gaps being non-angular channels; and a plurality of said electron beams, wherein individual said electron beams impinges on individual said sources to generate evaporated vapor flux to at least partially coat a plurality of said substrates, each of said substrates being coated respectively from a singular said evaporant source.

14. The apparatus of claim 11, further comprising:

a plurality of said nozzles, wherein said nozzle gaps being non-angular channels; and a plurality of said electron beams, wherein individual said electron beams impinges on individual said sources to generate an evaporated vapor flux to at least partially coat a singular said substrate, said substrate being coated from said plurality of said evaporant sources.

15. The apparatus of claim 11, further comprising:

a plurality of said nozzles, wherein said nozzle gaps being angular channels; and a singular said electron beam, wherein said electron beam impinges on individual said sources to generate evaporated vapor flux to at least partially coat a plurality of said substrates, each of said substrates being coated respectively from a singular said evaporant source.

16. The apparatus of claim 11, further comprising:

a plurality of said nozzles, wherein said nozzle gaps being angular channels; and a singular said electron beam, wherein said singular electron beam impinges on individual said evaporant sources to generate an evaporated vapor flux to at least partially coat a singular said substrate, said substrate being coated from said plurality of said evaporant sources.

17. The apparatus of claim 11, wherein at least one said nozzle comprises a converging/diverging nozzle.

18. A method for applying at least one coating on at least one substrate comprising:

presenting said at least one substrate to a chamber, wherein said chamber has an operating pressure ranging from about 0.1 to about 32,350 Pa;

presenting at least one evaporant source to said chamber;

presenting at least one carrier gas stream to said chamber, wherein said carrier gas stream is provided by at least one converging/diverging nozzle;

impinging said at least one evaporant source with at least one electron beam in said chamber to generate an evaporated vapor flux in a main direction toward said substrate;

entraining said at least one generated evaporated vapor flux by said at least one carrier gas stream, wherein said carrier gas stream is essentially parallel to said main direction and substantially surrounds said evaporated flux, wherein said evaporated vapor flux at least partially coats at least one said substrate, and wherein:

said at least one carrier gas stream is generated from said at least one nozzle and said at least one evaporant source is disposed in said at least one nozzle, wherein at least one said nozzle comprises: at least one nozzle gap wherein said at least one said carrier gas flows therefrom;

wherein at least one said nozzle gap is defined by a shape selected from the group consisting of: ring-shaped, elliptical-shaped, elongated elliptical-shaped, cross-hatch-shaped, segmented ring-shaped, segmented elliptical-shaped, and segmented elongated elliptical-shaped; and at least one evaporant retainer for retaining at least one said evaporant source, said evaporant retainer being at least substantially surrounded by at least one said nozzle gap.

* * * * *